(12) United States Patent
Kocon et al.

(10) Patent No.: US 9,356,133 B2
(45) Date of Patent: May 31, 2016

(54) MEDIUM VOLTAGE MOSFET DEVICE

(71) Applicant: Texas Instruments Incorporated, Dallas, TX (US)

(72) Inventors: Christopher Boguslaw Kocon, Mountain Top, PA (US); Hideaki Kawahara, Plano, TX (US); Simon John Molloy, Allentown, PA (US); Satoshi Suzuki, Ushiku Ibaraki (JP); John Manning Savidge Neilson, Norristown, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 501 days.

(21) Appl. No.: 13/744,097

(22) Filed: Jan. 17, 2013

(65) Prior Publication Data
US 2013/0193502 A1 Aug. 1, 2013

Related U.S. Application Data

(60) Provisional application No. 61/593,692, filed on Feb. 1, 2012, provisional application No. 61/594,706, filed on Feb. 3, 2012, provisional application No. 61/594,726, filed on Feb. 3, 2012, provisional application No. 61/733,972, filed on Dec. 6, 2012.

(51) Int. Cl.
*H01L 29/78* (2006.01)
*H01L 29/66* (2006.01)
*H01L 29/423* (2006.01)
*H01L 29/08* (2006.01)
*H01L 29/40* (2006.01)
*H01L 29/45* (2006.01)
*H01L 29/06* (2006.01)

(52) U.S. Cl.
CPC ........ *H01L 29/7811* (2013.01); *H01L 29/0878* (2013.01); *H01L 29/407* (2013.01); *H01L 29/42372* (2013.01); *H01L 29/42376* (2013.01); *H01L 29/66181* (2013.01); *H01L 29/66712* (2013.01); *H01L 29/66719* (2013.01); *H01L 29/66727* (2013.01); *H01L 29/7803* (2013.01); *H01L 29/0696* (2013.01); *H01L 29/402* (2013.01); *H01L 29/4238* (2013.01); *H01L 29/456* (2013.01)

(58) Field of Classification Search
None
See application file for complete search history.

(56) References Cited

U.S. PATENT DOCUMENTS

| 5,559,357 | A | * | 9/1996 | Krivokapic | 257/336 |
|---|---|---|---|---|---|
| 5,973,360 | A | * | 10/1999 | Tihanyi | H01L 29/0653 257/330 |
| 2009/0008709 | A1 | * | 1/2009 | Yedinak et al. | 257/331 |
| 2012/0012861 | A1 | * | 1/2012 | Nakano et al. | 257/77 |

* cited by examiner

*Primary Examiner* — Whitney T Moore
*Assistant Examiner* — Scott R Wilson
(74) *Attorney, Agent, or Firm* — Daniel Chan; Frank D. Cimino

(57) ABSTRACT

A semiconductor device includes a medium voltage MOSFET having a vertical drain drift region between RESURF trenches containing field plates which are electrically coupled to a source electrode of the MOSFET. A split gate with a central opening is disposed above the drain drift region between the RESURF trenches. A two-level LDD region is disposed below the central opening in the split gate. A contact metal stack makes contact with a source region at lateral sides of the triple contact structure, and with a body contact region and the field plates in the RESURF trenches at a bottom surface of the triple contact structure. A perimeter RESURF trench surrounds the MOSFET. A field plate in the perimeter RESURF trench is electrically coupled to the source electrode of the MOSFET. An integrated snubber may be formed in trenches formed concurrently with the RESURF trenches.

10 Claims, 39 Drawing Sheets

US 9,356,133 B2

MEDIUM VOLTAGE MOSFET DEVICE

CROSS-REFERENCE TO RELATED APPLICATIONS

This application claims the benefit of priority under U.S.C. §119(e) of U.S. Provisional Application 61/593,692 (TI-71962PS) filed Feb. 1, 2012, U.S. Provisional Application 61/594,706 (TI-71963PS) filed Feb. 3, 2012, U.S. Provisional Application 61/594,726 (TI-71969PS) filed Feb. 3, 2012, and U.S. Provisional Application 61/733,972 (TI-71980PS) filed Dec. 6, 2012.

FIELD OF THE INVENTION

This invention relates to the field of semiconductor devices. More particularly, this invention relates to MOS transistors in semiconductor devices.

BACKGROUND OF THE INVENTION

A medium voltage metal oxide semiconductor field effect transistor (MOSFET) may be used for power regulation or power switching applications. Some versions of a medium voltage MOSFET may be fabricated to operate at approximately 10 volts; other versions may be fabricated to operate as high as 200 volts. Forming a medium voltage MOSFET with desired values of on-state resistance, size and reliability for the intended operating voltage may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a medium voltage MOSFET having a vertical drain drift region between RESURF trenches. The RESURF trenches contain field plates which are electrically coupled to a source electrode of the MOSFET. A drain contact region is disposed below the RESURF trenches. A contact metal stack makes electrical contact with a source region at lateral sides of the triple contact structure, makes electrical contact with a body contact region at a bottom surface of the triple contact structure, and makes electrical contact to the field plates in the RESURF trenches at the bottom surface of the triple contact structure. A perimeter RESURF trench surrounds the MOSFET. A field plate in the perimeter RESURF trench is electrically coupled to the contact metal stack of the MOSFET.

In one embodiment, a planar split gate is disposed above the drain drift region. A centrally located lightly doped drain (LDD) region is disposed above the drain drift region below the split gate. In another embodiment, an integrated snubber is formed in one or more snubber trenches formed concurrently with the RESURF trenches. Snubber capacitor plates in the snubber trenches, formed concurrently with the field plates in the RESURF trenches, are electrically coupled to the contact metal stack.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Examples described in this specification are for n-channel MOSFETs. It will be recognized that p-channel MOSFETs having similar features may be formed by appropriate changes in dopant polarities and conductivity types.

For the purposes of this description, the term "RESURF" will be understood to refer to a material which reduces an electric field in an adjacent semiconductor region. A RESURF region may be for example a semiconductor region with an opposite conductivity type from the adjacent semiconductor region. RESURF structures are described in Appels, et.al., "Thin Layer High Voltage Devices" Philips J, Res. 35 1-13, 1980.

Figure 1A:
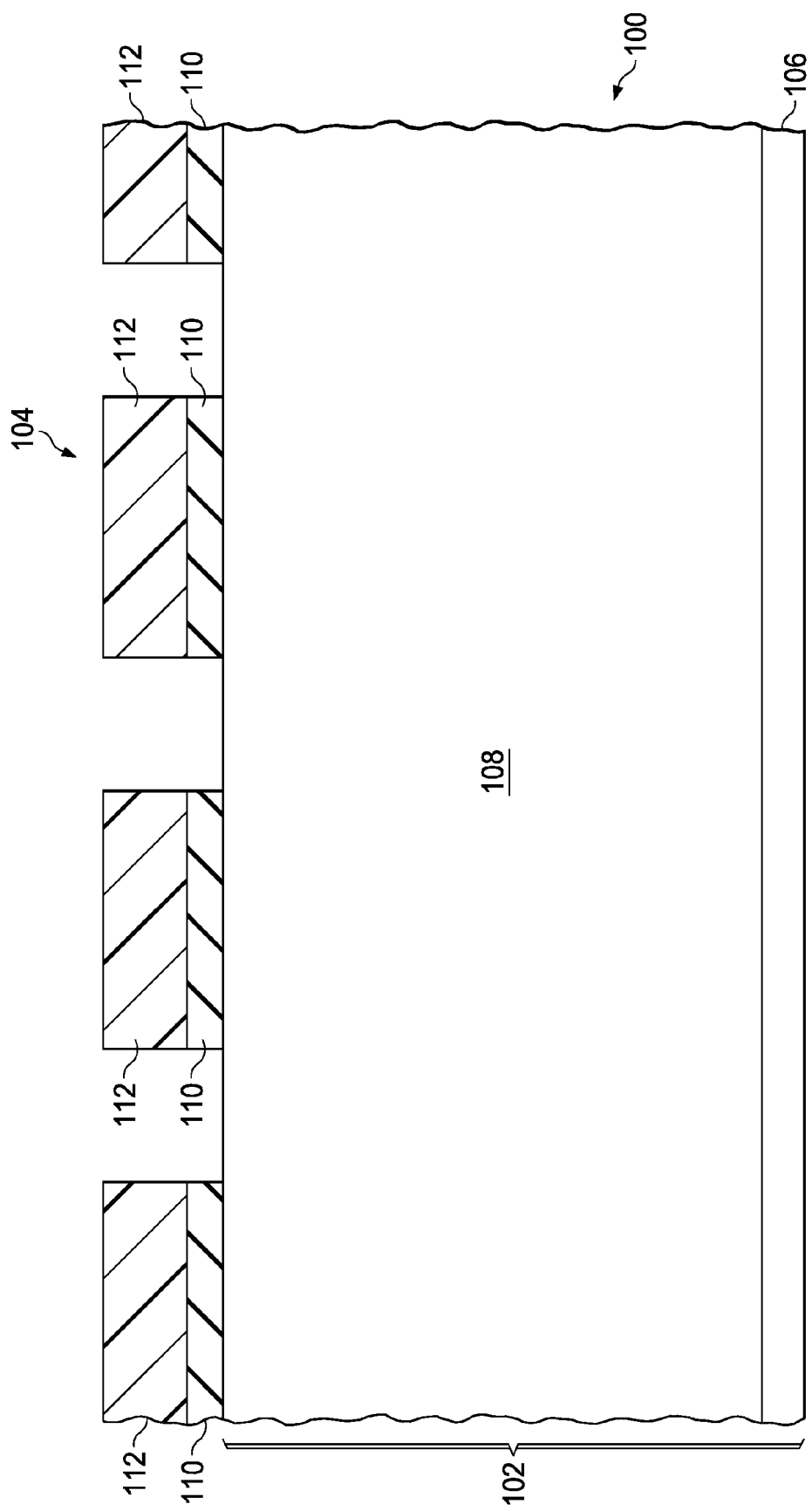
FIG. 1A through FIG. 1P are cross sections of a semiconductor device containing a medium voltage MOSFET, depicted in successive stages of fabrication.
Figure 1B:
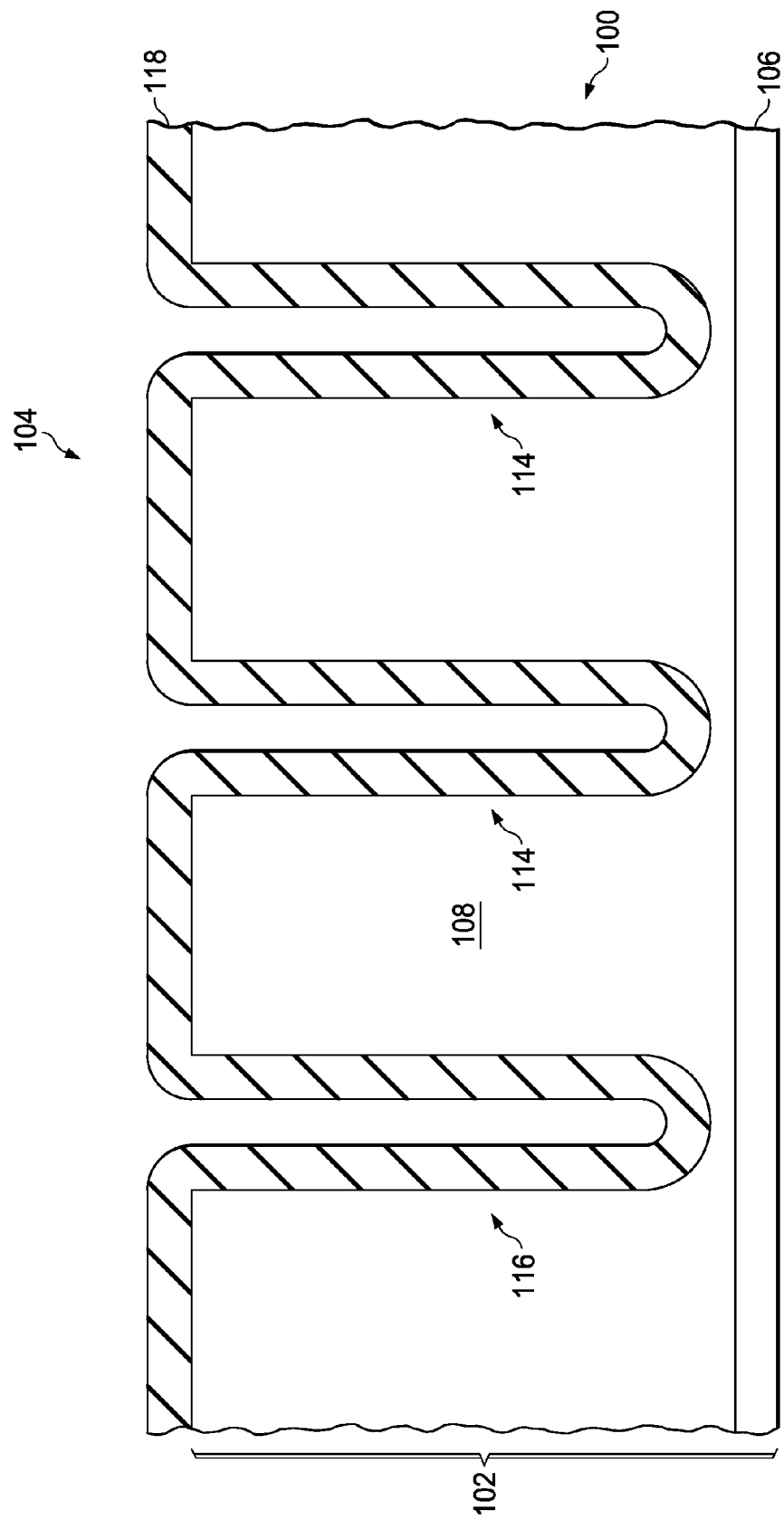
Figure 1C:
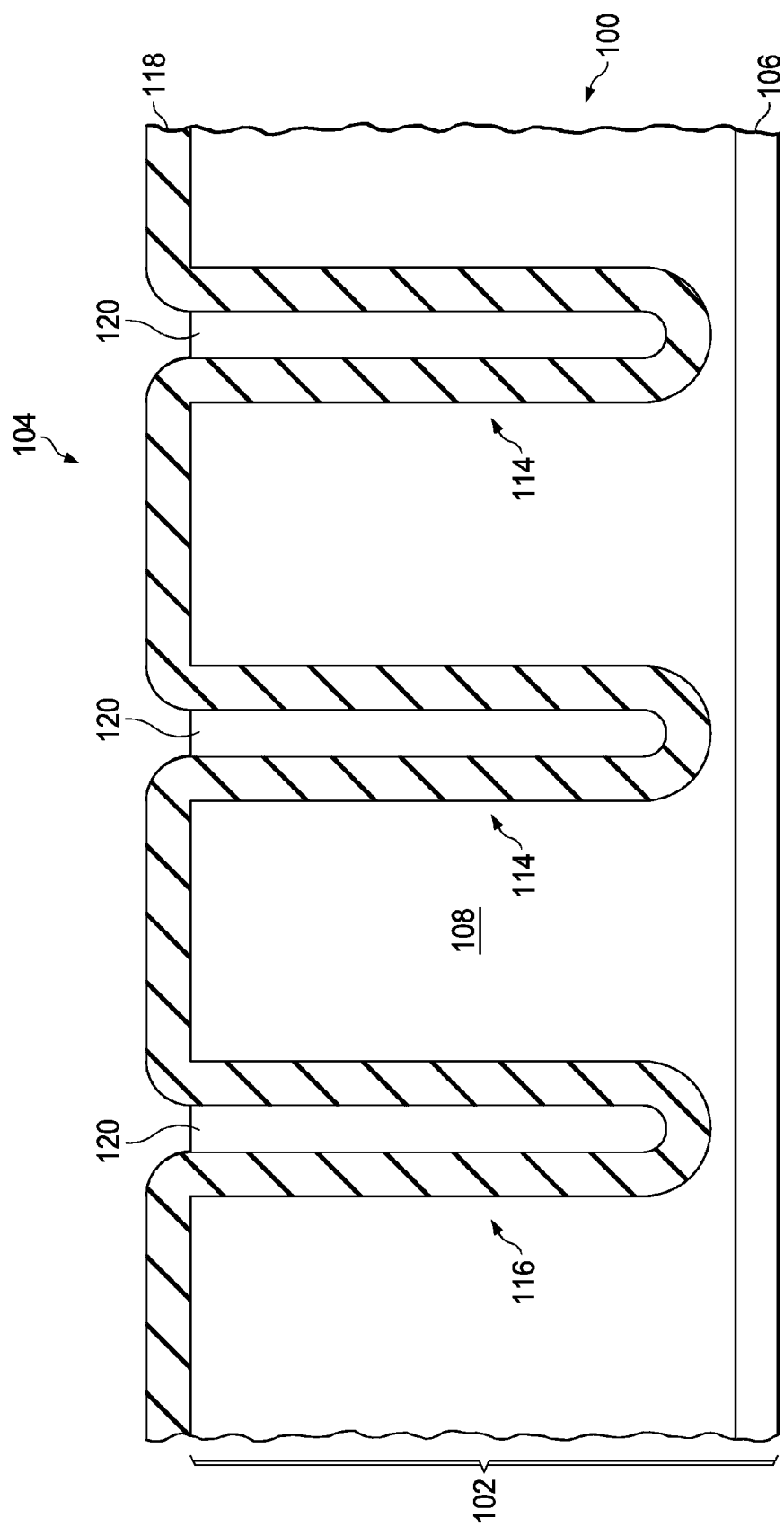
Figure 1D:
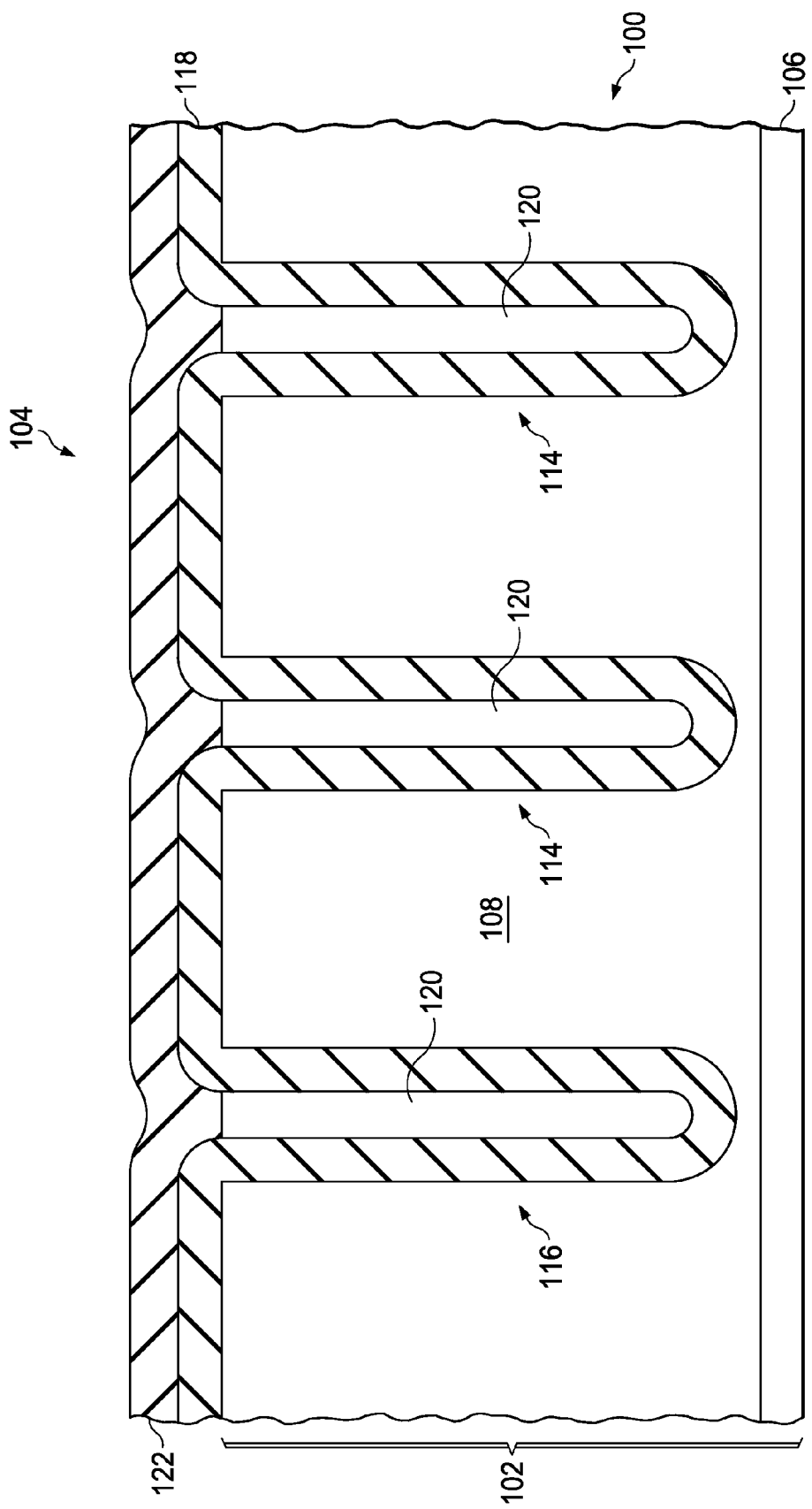
Figure 1E:
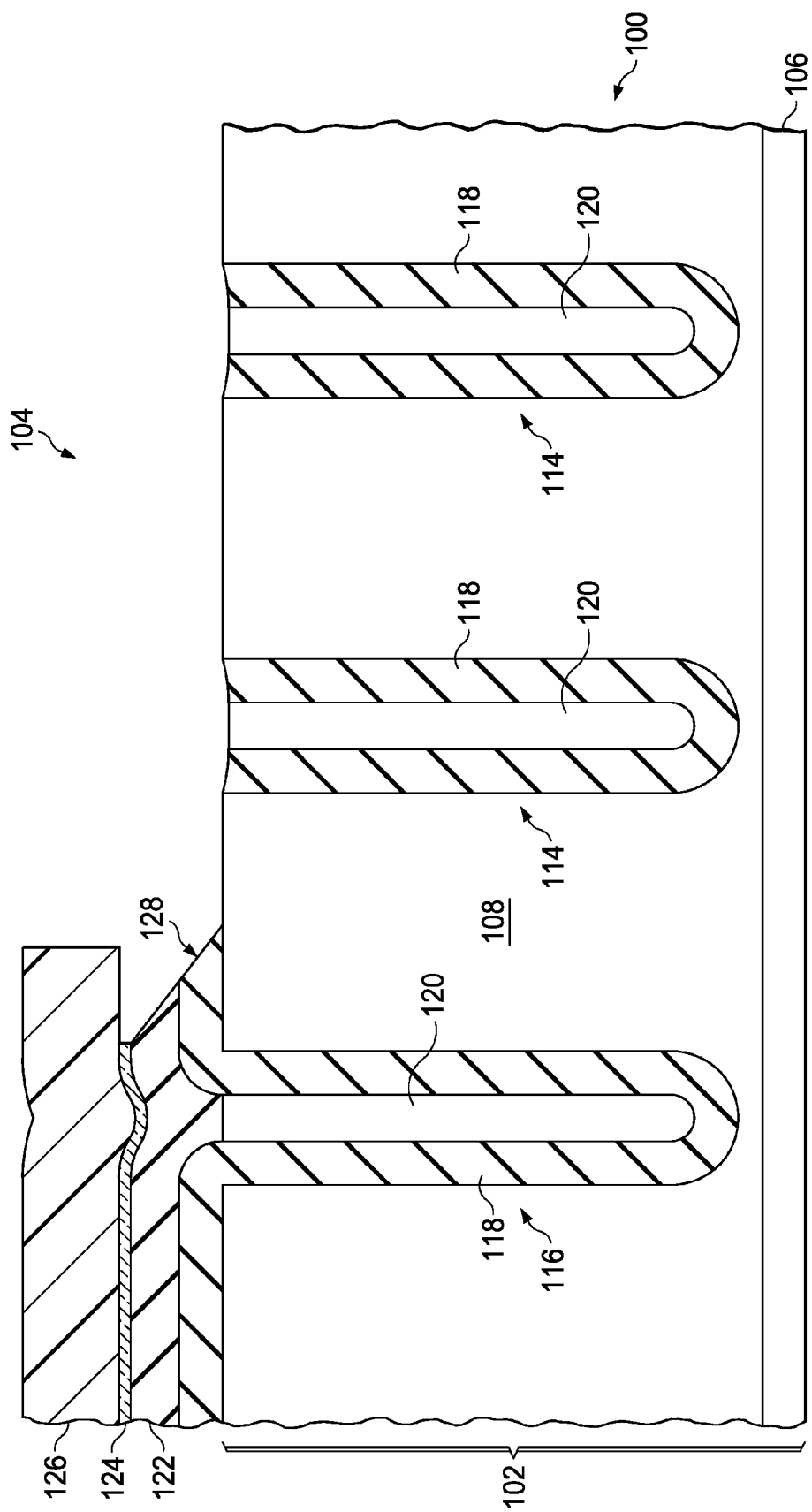
Figure 1F:
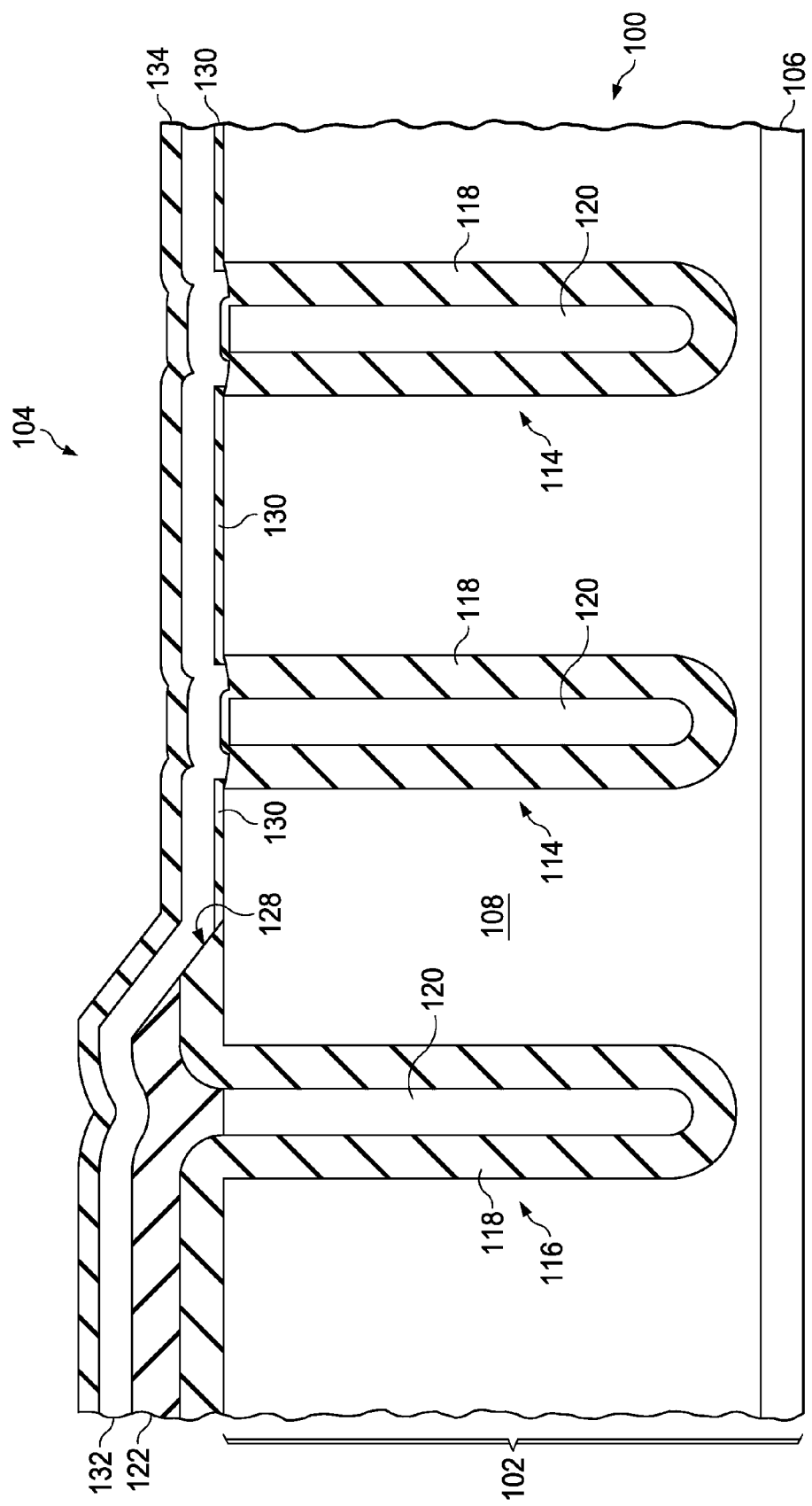
Figure 1G:
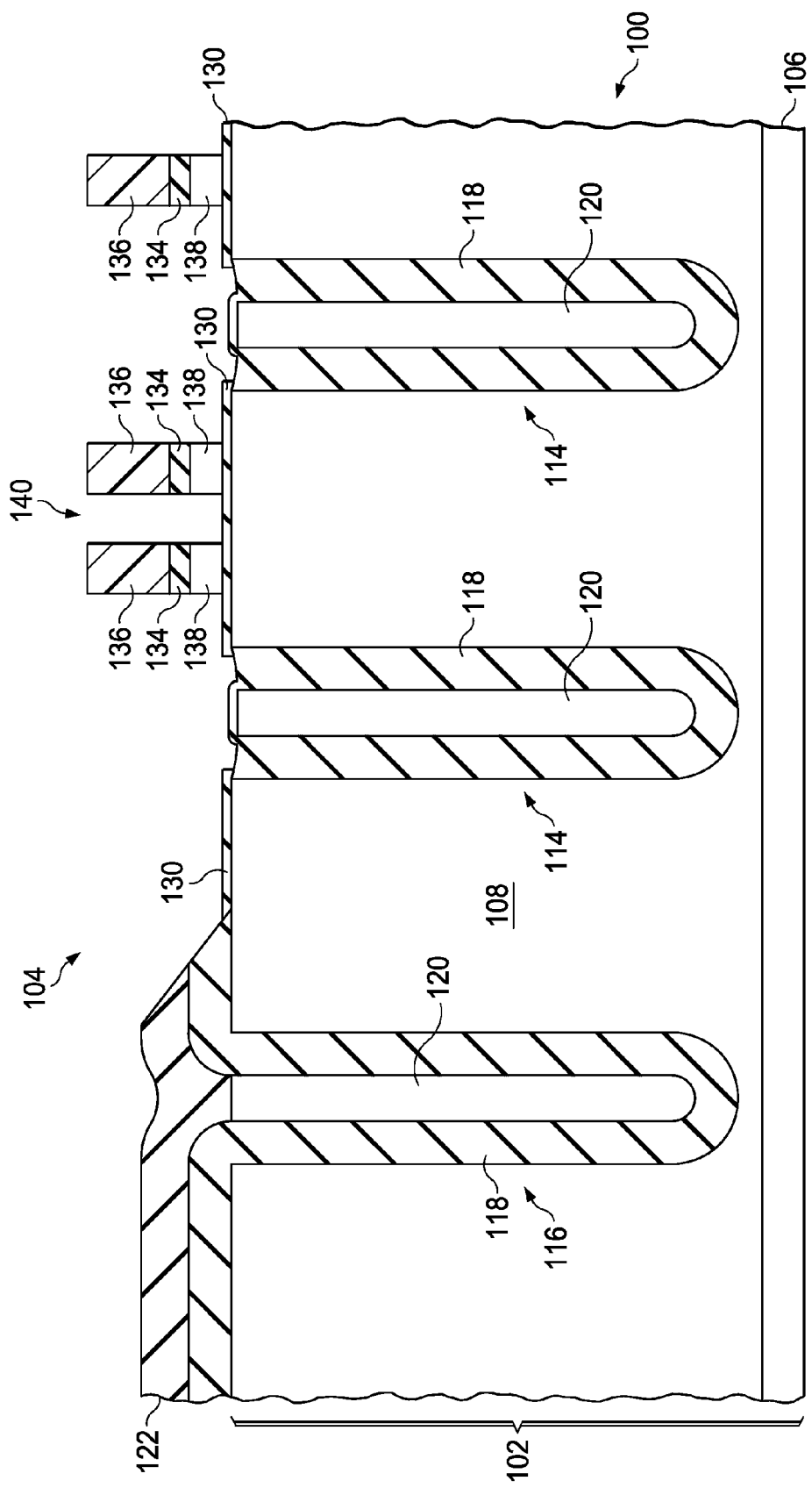
Figure 1H:
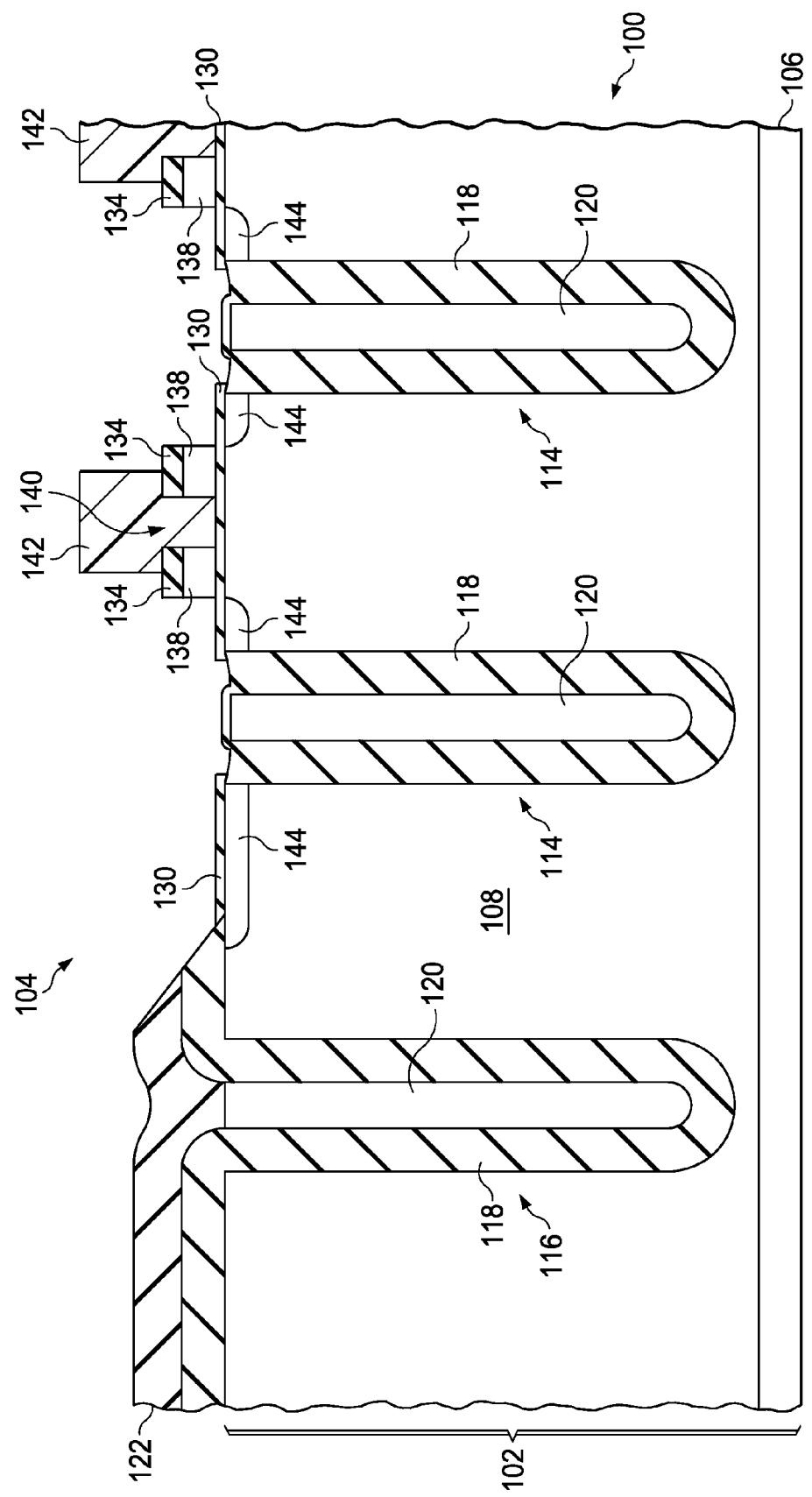
Figure 1I:
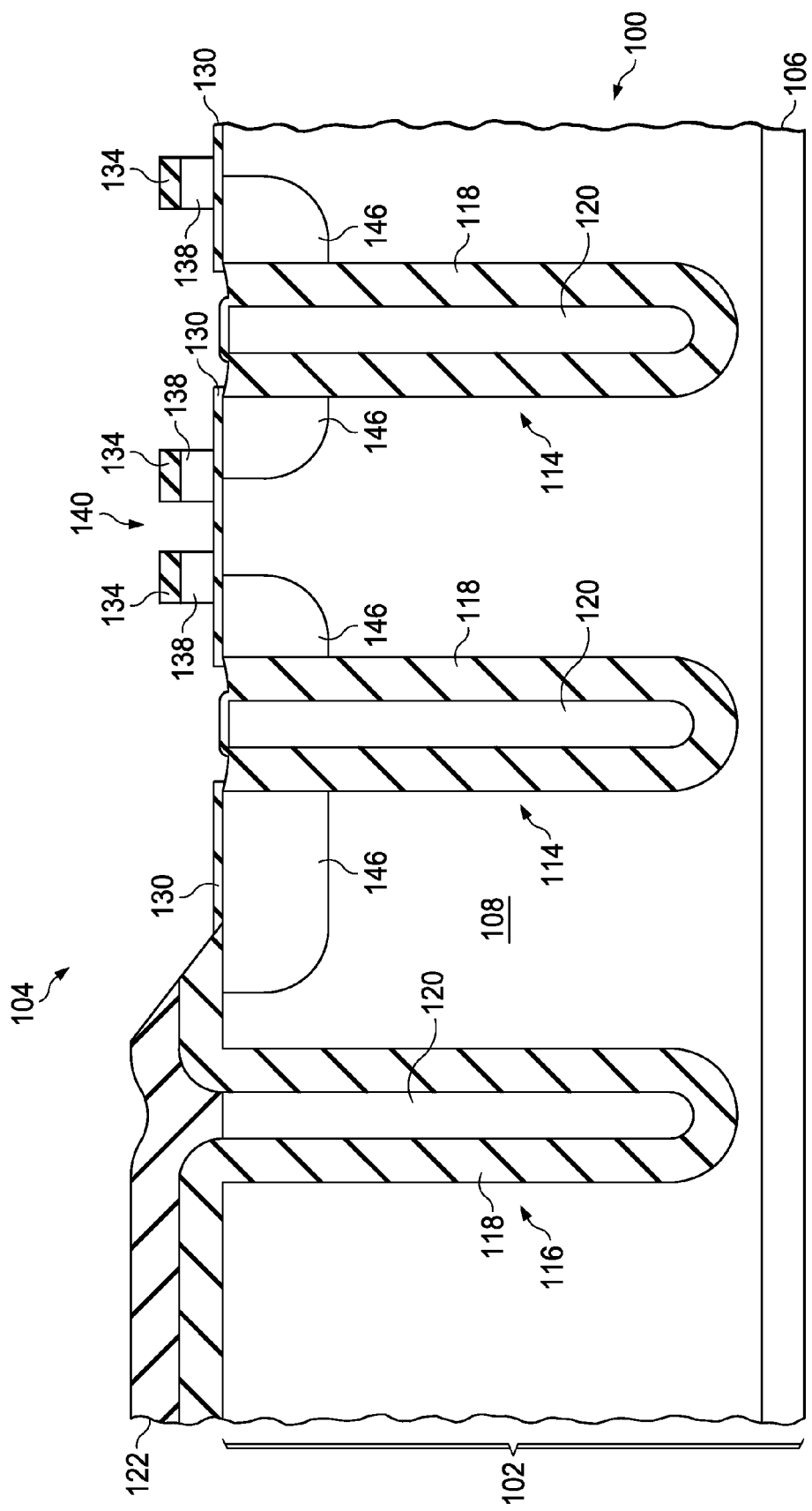
Figure 1J:
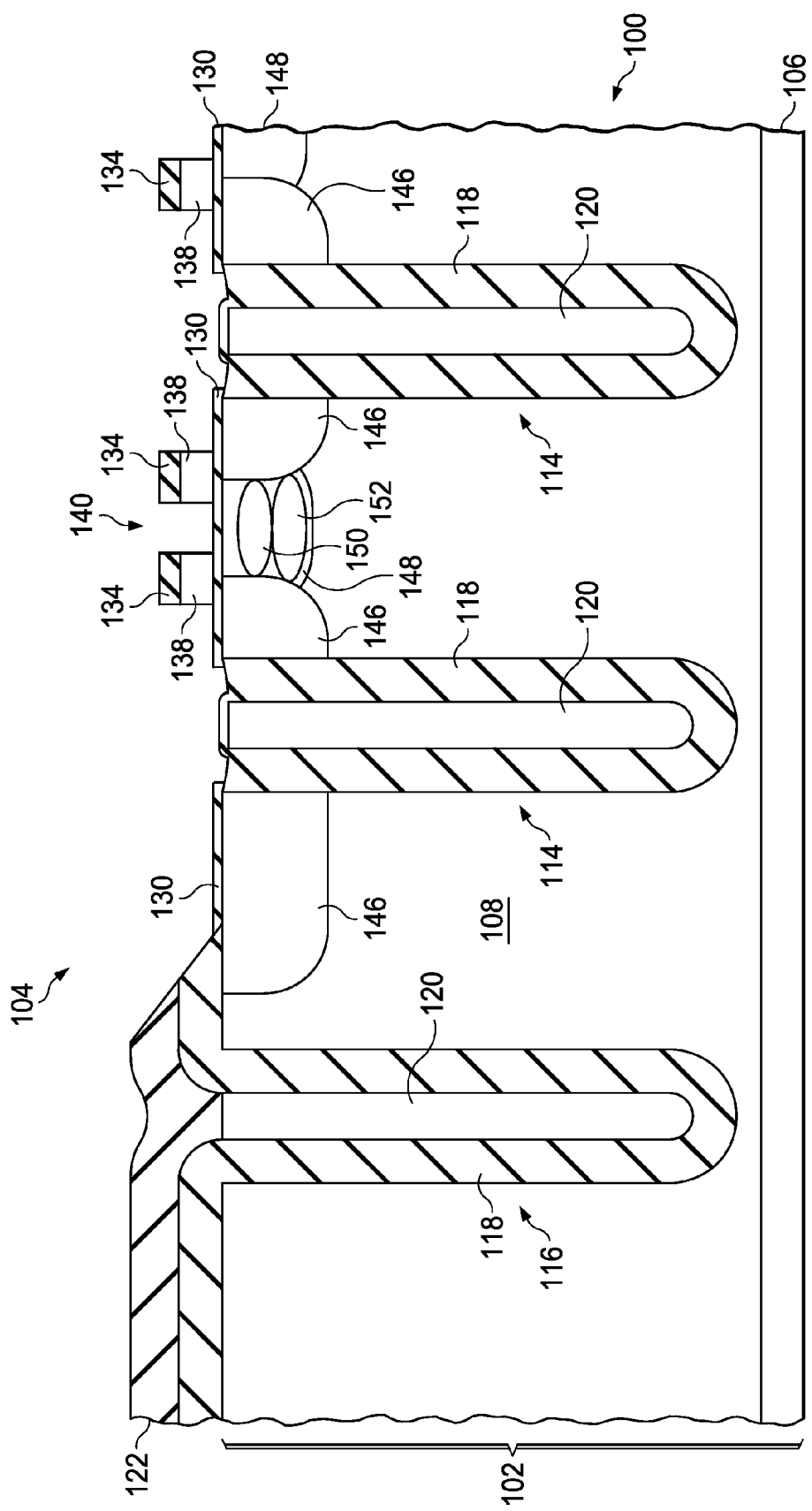
Figure 1K:
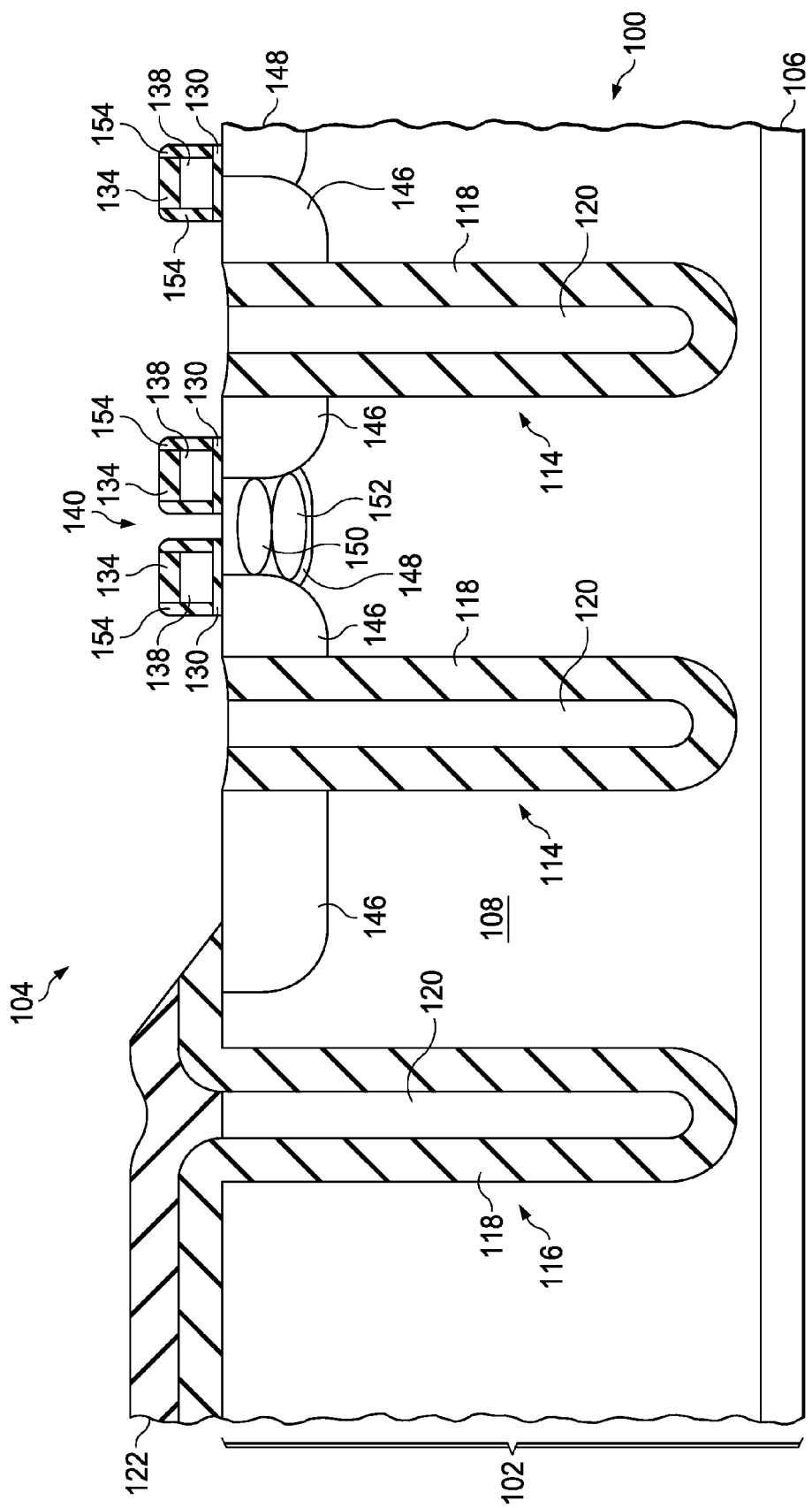
Figure 1L:
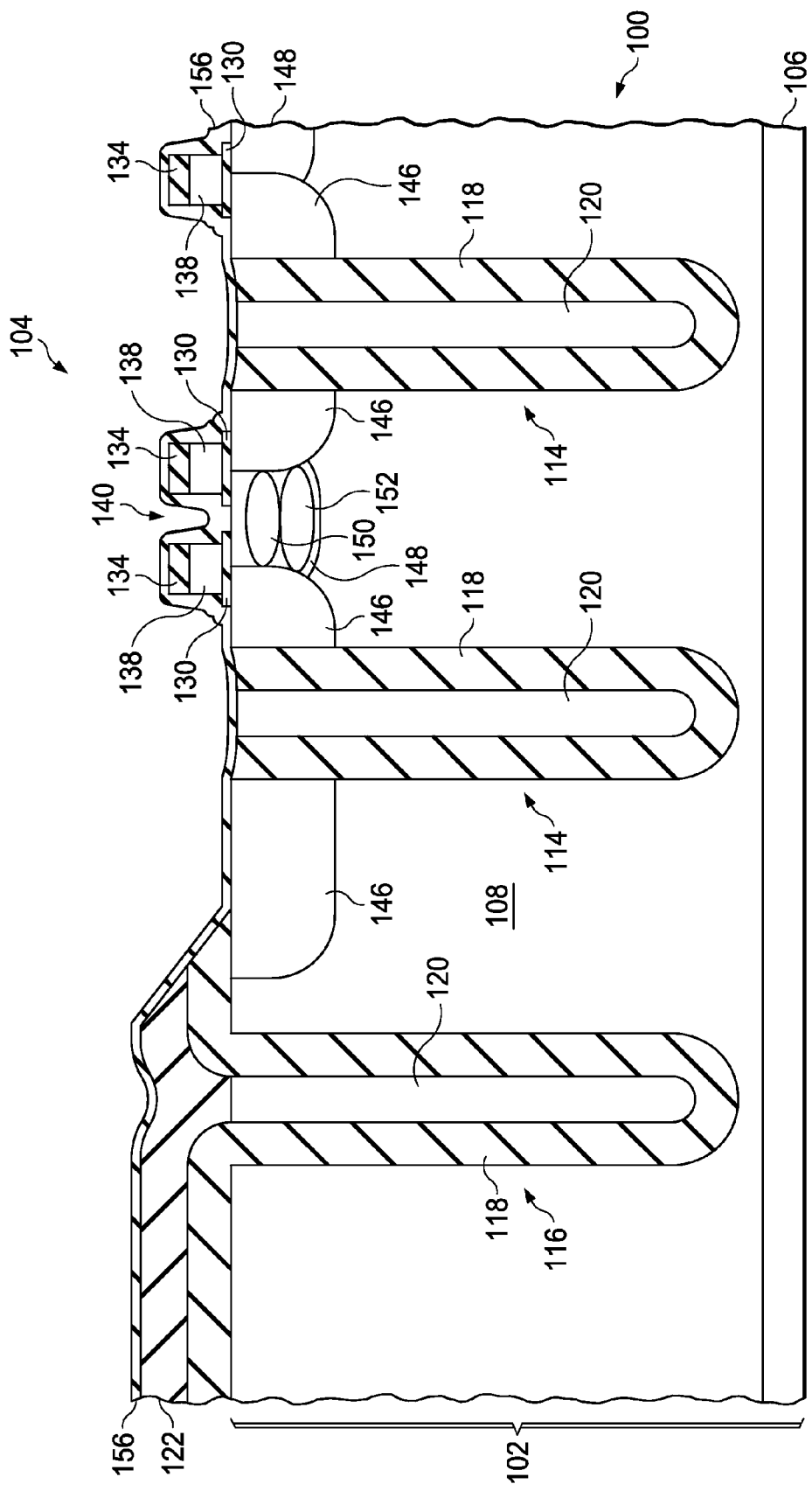
Figure 1M:
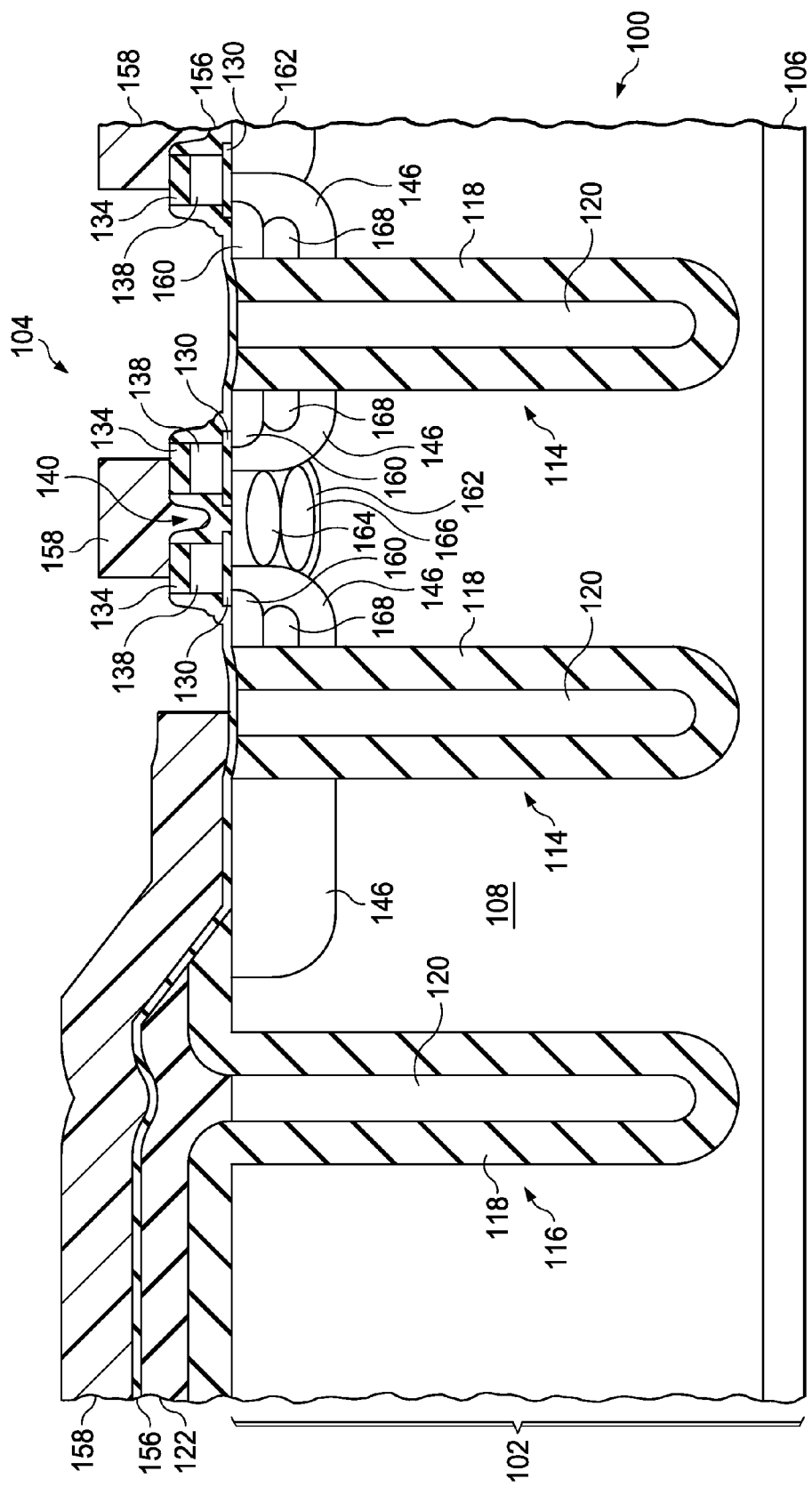
Figure 1N:
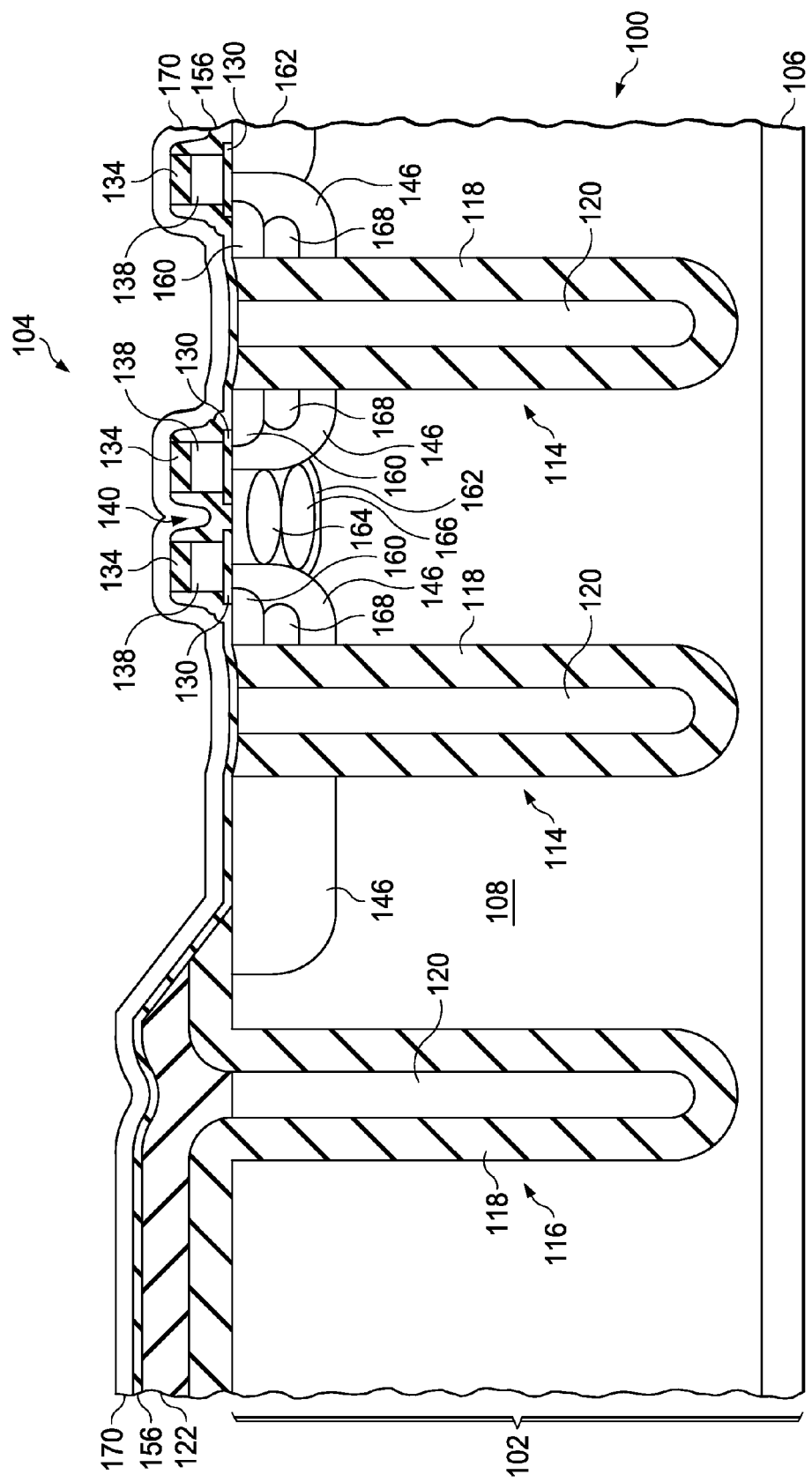
Figure 1O:
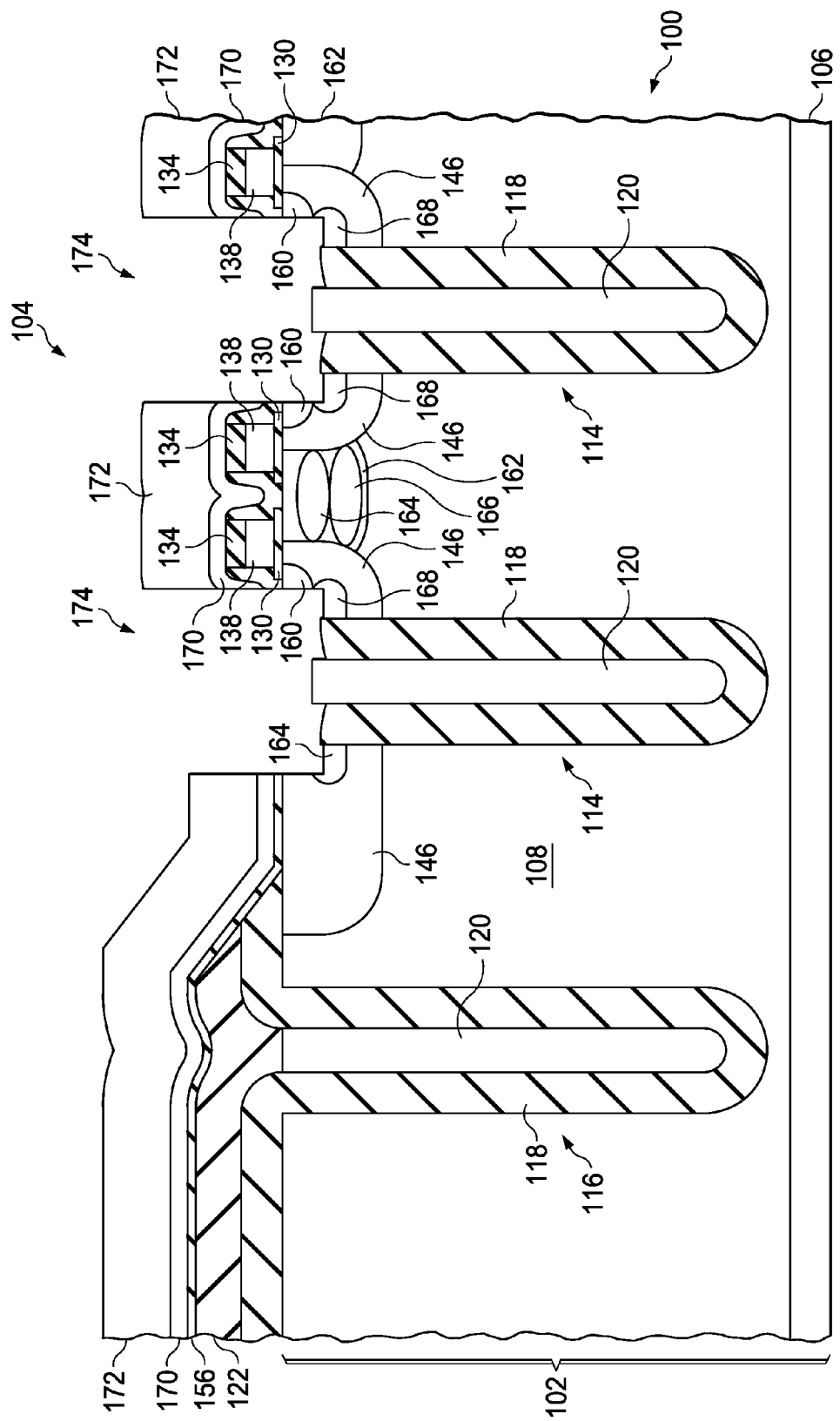
Figure 1P:
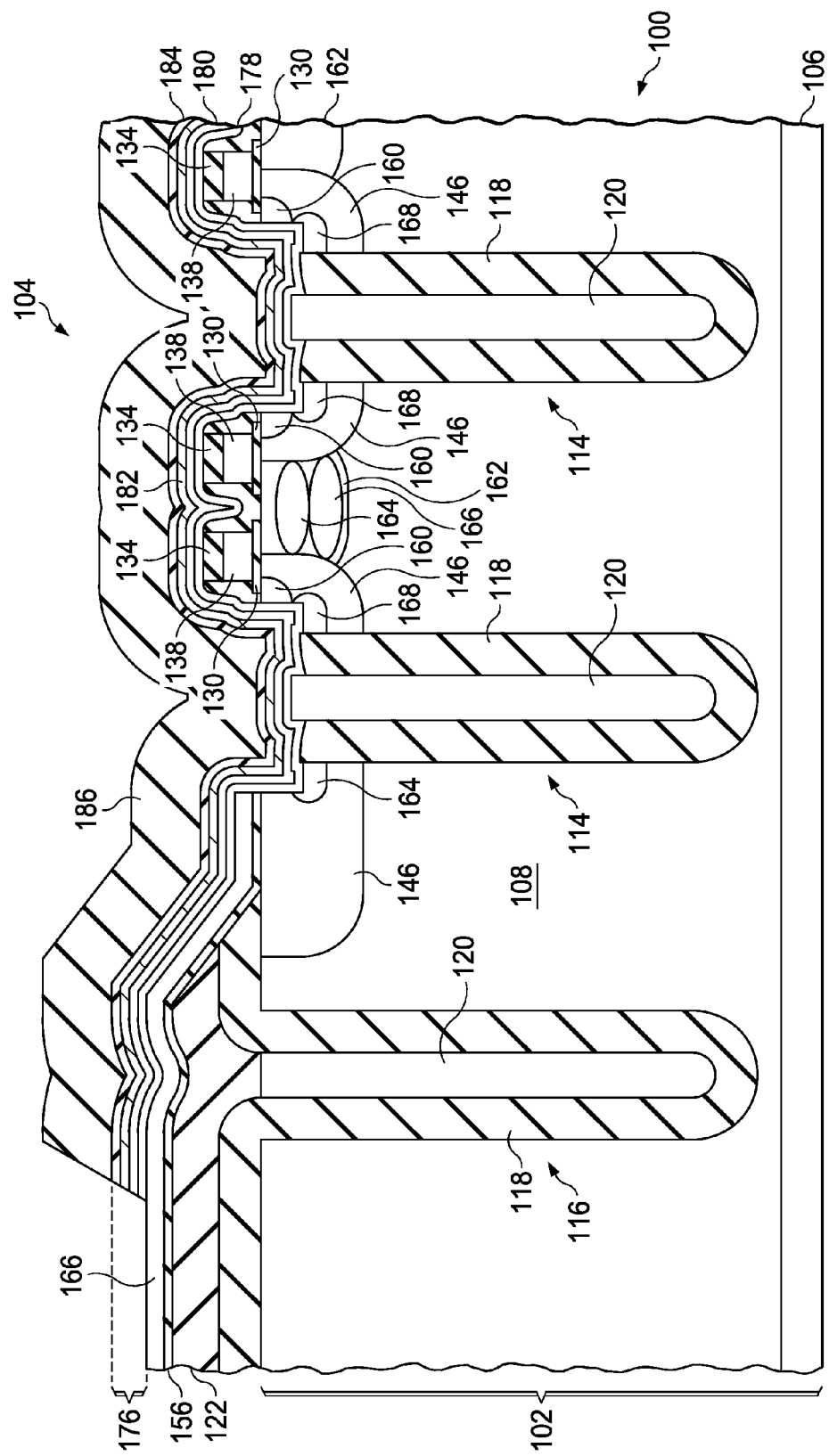

FIG. 1A through FIG. 1P are cross sections of a semiconductor device containing a medium voltage MOSFET, depicted in successive stages of fabrication. Referring to FIG. 1A, the semiconductor device 100 is formed in and on a semiconductor substrate 102. The substrate 102 may be, for example, a silicon wafer. An n-type drain contact region 106 of a medium voltage MOSFET 104 is formed below a top surface of the substrate 102 and an n-type drift region 108 is formed over the drain contact region 106, extending to the top surface of the substrate 102. The drain contact region 106 may have a doping density of $1 \times 10^{18}$ cm$^{-3}$ to $1 \times 10^{21}$ cm$^{-3}$ and may be formed by an ion implant process or a furnace diffusion process at an existing top surface of the substrate 102. The drift region 108 may be formed by epitaxial growth of semiconductor material on the drain contact region 106. A thickness and doping density of the drift region 108 may depend on an operating voltage of the medium voltage MOSFET 104. For example, a medium voltage MOSFET 104 designed to operate at 30 volts may have a drift region 108 4 microns thick with an average doping density of $5\times10^{16}$ cm$^{-3}$ to $1\times10^{17}$ cm$^{-3}$. A medium voltage MOSFET 104 designed to operate at 60 volts may have a drift region 108 7 microns thick with an average doping density of $1\times10^{16}$ cm$^{-3}$ to $5\times10^{16}$ cm$^{-3}$. A medium voltage MOSFET 104 designed to operate at 100 volts may have a drift region 108 10 microns thick with an average doping density of $1\times10^{16}$ cm$^{-3}$ to $5\times10^{16}$ cm$^{-3}$. And a medium voltage MOSFET 104 designed to operate at 200 volts may have a drift region 108 20 microns thick with an average doping density of $1\times10^{16}$ cm$^{-3}$ to $5\times10^{16}$ cm$^{-3}$. Doping in the drift region 108 may be formed by in-situ doping during epitaxial growth or by ion implant and subsequent diffusion during a thermal drive operation.

A trench etch hard mask 110 is formed over the substrate 102, for example by forming a layer of dielectric material over the substrate 102 and patterning the layer of dielectric material using a photoresist etch mask 112. The trench etch hard mask 110 may include 20 to 30 nanometers of thermally grown silicon dioxide and 200 to 300 nanometers of deposited silicon dioxide. The trench etch hard mask 110 may be patterned using a reactive ion etch (RIE) process or using a wet etch of buffered aqueous hydrofluoric acid.

Referring to FIG. 1B, transistor RESURF trenches 114 and a perimeter RESURF trench 116 are concurrently formed in the drift region 108 by removing substrate material in areas exposed by the trench etch hard mask 110 of FIG. 1A. The perimeter RESURF trench 116 surrounds the transistor RESURF trenches 114. The transistor RESURF trenches 114 and the perimeter RESURF trench 116 may be 0.6 to 1.5 microns wide, and separated by 1.5 to 3.5 microns. Bottoms of the transistor RESURF trenches 114 and the perimeter RESURF trench 116 may be, for example, a half micron to a micron above the drain contact region 106. The transistor RESURF trenches 114 and the perimeter RESURF trench 116 may be formed using an RIE process which forms polymers on sidewalls of trenches while etching bottoms of the trenches, so as to maintain a nearly constant trench width. The trench etch hard mask 110 may be subsequently removed.

A trench liner 118 of dielectric material is formed in the transistor RESURF trenches 114 and the perimeter RESURF trench 116 and possibly over a top surface of the substrate 102. The trench liner 118 may include, for example, 50 nanometers of thermally grown silicon dioxide contacting the substrate 102 and 200 nanometers of deposited silicon dioxide using a chemical vapor deposition (CVD) process, for a medium voltage MOSFET 104 designed to operate at 30 volts. A medium voltage MOSFET 104 designed to operate at 200 volts may have a trench liner 118 with 150 nanometers of thermally grown silicon dioxide contacting the substrate 102 and 800 nanometers of CVD silicon dioxide.

Referring to FIG. 1C, RESURF field plates 120 are formed in the transistor RESURF trenches 114 and the perimeter RESURF trench 116 on the trench liner 118. The RESURF field plates 120 may include polycrystalline silicon, also referred to as polysilicon, formed by thermally decomposing silane gas inside a low-pressure reactor at a temperature between 580° C. to 650° C. in the transistor RESURF trenches 114 and the perimeter RESURF trench 116 and on a top surface of the trench liner 118. Alternatively, the RESURF field plates 120 may include amorphous silicon, formed by thermally decomposing silane gas inside a low-pressure reactor at a temperature below 580° C. N-type dopants such as phosphorus or p-type dopants such as boron are implanted into the polysilicon at a dose of $8\times10^{14}$ cm to $1\times10^{16}$ cm$^{-2}$. A thermal drive operation diffuses the dopants into the polysilicon in the transistor RESURF trenches 114 and the perimeter RESURF trench 116. Alternately, the polysilicon may be doped to a desired level during formation using appropriate dopant reagents. Unwanted polysilicon may subsequently be removed from a top surface of the trench liner 118 using a plasma etch process or a wet etch process, to leave the RESURF field plates 120 with top surfaces approximately coplanar with, or slightly lower than, the top surface of the substrate 102.

Referring to FIG. 1D, a drain dielectric layer 122 is formed over an existing top surface of the semiconductor device 100. The drain dielectric layer 122 may include 200 nanometers of silicon dioxide, for a medium voltage MOSFET 104 designed to operate at 30 volts, to 1000 nanometers of silicon dioxide, for a medium voltage MOSFET 104 designed to operate at 200 volts, formed by a plasma enhanced chemical vapor deposition (PECVD) process using tetraethyl orthosilicate, also known as tetraethoxysilane or TEOS.

Referring to FIG. 1E, an optional layer of phosphosilicate glass 124, for example 30 to 80 nanometers thick, may be formed on the drain dielectric layer 122. A drain dielectric etch mask 126 is formed over an existing top surface of the semiconductor device 100 which, in the instant example, exposes the drain dielectric layer 122 over the transistor RESURF trenches 114 and covers the drain dielectric layer 122 over the perimeter RESURF trench 116. A drain dielectric etch process removes the drain dielectric layer 122 and the trench liner 118 over the top surface of the substrate 102, so that a top surface of the remaining trench liner 118 is approximately coplanar with the top surfaces of the RESURF field plates 120. The drain dielectric etch process is performed so that an edge 128 of the drain dielectric layer 122 and the trench liner 118 has a sloped profile of, for example, 30 degrees to 60 degrees from a horizontal plane. In a version of the instant example in which the optional layer of phosphosilicate glass 124 is present, the drain dielectric etch may include a wet etch using buffered aqueous hydrofluoric acid to provide the sloped edge 128; the phosphosilicate glass 124 etches more quickly than the drain dielectric layer 122, so that an edge of a top surface of the drain dielectric layer 122 is continually exposed, producing the desired sloped profile. In another version of the instant example in which the layer of phosphosilicate glass 124 is not present, the drain dielectric etch may include a dry etch followed by a wet etch to produce the desired sloped profile. The drain dielectric etch mask 126 is subsequently removed.

Referring to FIG. 1F, a gate dielectric layer 130 is formed on the top surface of the substrate 102. A cleanup etch, for example a wet etch using dilute hydrofluoric acid, may be performed prior to forming the gate dielectric layer to remove any unwanted oxide on the substrate 102. The gate dielectric layer 130 may be 80 to 85 nanometers of thermally grown silicon dioxide for a medium voltage MOSFET 104 designed to operate at 30 volts, to 540 to 560 nanometers for a medium voltage MOSFET 104 designed to operate at 200 volts. The gate dielectric layer 130 may include one or more layers of other dielectric material such as silicon oxynitride or hafnium oxide.

A layer of gate material 132 is formed over the gate dielectric layer 130, extending over the sloped edge 128 of the drain dielectric layer 122 and the trench liner 118 and over a top surface of the drain dielectric layer 122. The layer of gate material 132 may include 100 to 200 nanometers of polysilicon and possibly a layer of metal silicide on the polysilicon, such as 100 to 200 nanometers of tungsten silicide. Other materials for the layer of gate material 132 are within the scope of the instant example. The layer of gate material 132 is continuous over the sloped edge 128 of the drain dielectric layer 122 and the trench liner 118. Forming the sloped edge 128 of the drain dielectric layer 122 and the trench liner 118 advantageously enables the formation process for the layer of gate material 132 to have a wide process latitude and maintain continuity over the sloped edge 128. A layer of cap dielectric 134 is formed over the layer of gate material 132. The layer of cap dielectric 134 may include 50 to 150 nanometers of silicon dioxide formed by a PECVD process.

Referring to FIG. 1G, a gate etch mask 136 is formed over the layer of cap dielectric 134. The gate etch mash 136 may include photoresist, an anti-reflection layer and/or a hard mask layer. A gate etch process removes unwanted material from the layer of gate material 132 of FIG. 1F to form a split gate 138 over the drift region 108 between the transistor RESURF trenches 114. The split gate 138 is recessed from edges of the transistor RESURF trenches 114, and has a central opening 140 in a central area between the transistor RESURF trenches 114.

Referring to FIG. 1H, a body implant mask 142 is formed over the central opening 140 of the split gate 138 in the central area between the transistor RESURF trenches 114. P-type dopants such as boron are implanted at a dose of $3 \times 10^{13}$ cm$^{-2}$ to $2 \times 10^{14}$ cm$^{-2}$ into the substrate adjacent to the transistor RESURF trenches 114 to form a body implanted region 144. The body implanted region 144 extends between the transistor RESURF trenches 114 and the perimeter RESURF trench 116. The body implant mask 142 is removed after the p-type dopants are implanted, possibly using an oxygen ash followed by a wet cleanup with an aqueous mixture of hydrogen peroxide and sulfuric acid.

Referring to FIG. 1I, a thermal drive process diffuses and activates the p-type dopants in the body implanted region 144 of FIG. 1H to form a body region 146 abutting the transistor RESURF trenches 114 extending partway under the split gate 138. The thermal drive process may include heating the substrate 102 at 1100° C. for 90 minutes or equivalent conditions, for example, 1125° C. for 50 minutes, or 1050° C. for 270 minutes.

Referring to FIG. 1J, a blanket two-step LDD implant process is performed which implants n-type dopants such as phosphorus into the substrate 102 under the central opening 140 in the split gate 138 to form a two-level LDD implanted region 148. A channel control implant of the two-step LDD implant process may implant phosphorus at a dose of $7 \times 10^{11}$ cm$^{-2}$ to $2 \times 10^{12}$ cm$^{-2}$ and an energy of 100 keV to 200 keV to form a channel control implanted region 150. A punch-through implant of the two-step LDD implant process may implant phosphorus at a dose of $2 \times 10^{12}$ cm$^{-2}$ to $5 \times 10^{12}$ cm$^{-2}$ and an energy of 200 keV to 350 keV to form a punch-through implanted region 152 below the channel control implanted region 150. Implanting the n-type dopants in two steps advantageously provides independent control of a channel length and a drain-source breakdown voltage.

Referring to FIG. 1K, gate sidewall spacers 154 are formed on lateral surfaces of the split gate 138. The gate sidewall spacers 154 may be formed by forming a conformal layer of silicon dioxide 50 to 100 nanometers thick over an existing top surface of the semiconductor device 100 and removing the silicon dioxide from horizontal surfaces using an anisotropic etch process such as an RIE process.

Referring to FIG. 1L, a screen oxide layer 156 with a stress less that 100 megapascals (MPa) is formed over an existing top surface of the semiconductor device 100. The screen oxide layer 156 may include 10 nanometers to 30 nanometers of silicon dioxide, formed using a PECVD process or a low pressure chemical vapor deposition (LPCVD) process. Forming the screen oxide layer 156 with low stress using a PECVD or LPCVD process advantageously prevents stress defects in the substrate 102, compared to a screen oxide layer of thermally grown silicon dioxide.

Referring to FIG. 1M, a source implant mask 158 is formed over the central opening 140 in the split gate 138 and over the drift region 108 between the transistor RESURF trenches 114 and the perimeter RESURF trench 116. A source implant process implants n-type dopants such as phosphorus and/or arsenic into the substrate adjacent to the split gate 138 to form source implanted regions. The source implant process may include implanting arsenic at a dose of $8 \times 10^{14}$ cm$^{-2}$ to $1 \times 10^{16}$ cm$^{-2}$ and an energy of 20 keV to 70 keV. P-type dopants such as boron are implanted while the source implant mask 158 is in place, to form body contact implanted regions under the source implanted regions. The p-type dopant implant may include implanting boron at a dose of $5 \times 10^{13}$ cm$^{-2}$ to $1 \times 10^{15}$ cm$^{-2}$ and an energy of 30 keV to 100 keV. Implanting the p-type dopants in the body contact implanted regions using the source implant mask 158 may advantageously reduce a fabrication cost and complexity of the semiconductor device 100.

Subsequently, the source implant mask 158 is removed. The n-type dopants in the source implanted regions, the channel control implanted region 150, the punch-through implanted region 152, and the p-type dopants in the body contact implanted regions, are diffused and activated by a source anneal operation, to form n-type source regions 160, an n-type two-level LDD region 162 including a first level of a channel control region 164 and second level of a punch-through region 166 below the channel control region 164, and p-type body contact regions 168. The source regions 160 extend under the gate sidewall spacers 154. The body contact regions 168 are disposed under the source regions 160. The source anneal operation may include heating the substrate 102 at 1000° C. for 20 minutes in a nitrogen ambient or equivalent anneal conditions, for example, 1050° C. for 5 minutes, or 975° C. for 40 minutes. Forming the body contact regions 168 under the source regions 160 may increases a threshold current for turning on a vertical parasitic NPN bipolar transistor consisting of the source region 160, the body region 146, and the drift region 108, advantageously enabling the medium voltage MOSFET 104 to operate at a higher current.

Referring to FIG. 1N, a pre-metal dielectric (PMD) layer 170 is formed over an existing top surface of the semiconductor device 100. The PMD layer 170 may include 70 nanometers to 200 nanometers of silicon dioxide, formed for example using a PECVD process.

Referring to FIG. 1O, a source-contact etch mask 172 is formed over the PMD layer 170. In the instant example, the source-contact etch mask 172 exposes regions along the transistor RESURF trenches 114 and portions of the substrate 102 immediately abutting the transistor RESURF trenches 114. A source contact etch process removes material from the PMD layer 170, the substrate 102, the trench liner 118 and the RESURF field plates 120, to form source-contact trenches 174. The source-contact trenches 174 extend 200 nanometers to 400 nanometers below the top surface of the substrate 102 and expose the source regions 160 on sides of the source-contact trenches 174 and expose the body contact regions 168 and the RESURF field plates 120 on bottoms of the source-contact trenches 174. Forming the source-contact trenches 174 to expose the source regions 160 on sides of the source-contact trenches 174 and expose the body contact regions 168 and the RESURF field plates 120 on bottoms of the source-contact trenches 174 advantageously reduces area required the medium voltage MOSFET 104.

While the source-contact etch mask 172 is in place, additional p-type dopants may be implanted into the body contact regions 168. The additional body contact implant may include implanting boron at a dose of $8 \times 10^{14}$ cm$^{-2}$ to $1 \times 10^{16}$ cm$^{-2}$ and an energy of 15 keV to 40 keV. After the source contact etch process and the additional body contact implant are completed, the source-contact etch mask 172 is removed. The additional p-type dopants in the body contact regions 168 are activated by a body contact anneal operation, which may include heating the substrate 102 at 950° C. for 20 minutes in a nitrogen ambient or equivalent anneal conditions, for example, 975° C. for 10 minutes, or 925° C. for 40 minutes.

Referring to FIG. 1P, a contact metallization process forms a contact metal stack 176. The contact metallization process starts with formation of a titanium liner 178 on an existing top surface of the semiconductor device 100, contacting the source regions 160, the body contact regions 168 and the RESURF field plates 120. The titanium liner 178 may be 25 to 50 nanometers thick, formed by a sputter process.

A first titanium nitride layer 180 is formed on the titanium layer 178. The first titanium nitride layer 180 may be 15 to 30 nanometers thick, formed by a reactive sputter process. Forming the first titanium nitride layer 180 using a sputtering process advantageously provides the desired thickness of titanium nitride for a subsequent anneal at lower cost than using a CVD process. The titanium layer 178 and the first titanium nitride layer 180 are heated, for example to 700° C. to 740° C. for 20 to 60 seconds, to form ohmic contacts to the source regions 160, the body contact regions 168 and the RESURF field plates 120.

A second titanium nitride layer 182, 8 to 15 nanometers thick, is formed on the first titanium nitride layer 180 using a CVD process to provide a conformal layer. Forming the second titanium nitride layer 182 using a CVD process advantageously provides a more conformal layer to prevent diffusion of subsequently deposited aluminum to the substrate 102. A third titanium nitride layer 184, 15 to 30 nanometers thick, is formed on the second titanium nitride layer 182 using a reactive sputtering process. Forming the third titanium nitride layer 184 using a sputtering process advantageously provides the desired total thickness of titanium nitride for the contact metal stack 176 at lower cost than using a CVD process.

A source metal layer 186, for example 2 to 5 microns of sputtered aluminum, is formed on the contact metal stack 176. The source metal layer 186 and the contact metal stack 176 are patterned to cover the split gate 138, possibly using an etch mask and reactive ion etch process. Covering the split gate 138 with the source metal layer 186 and the contact metal stack 176 advantageously shields the split gate 138 from electrical transients in the semiconductor device 100 and advantageously reduces a gate-drain capacitance, enabling higher switching speeds.

Figure 2A:
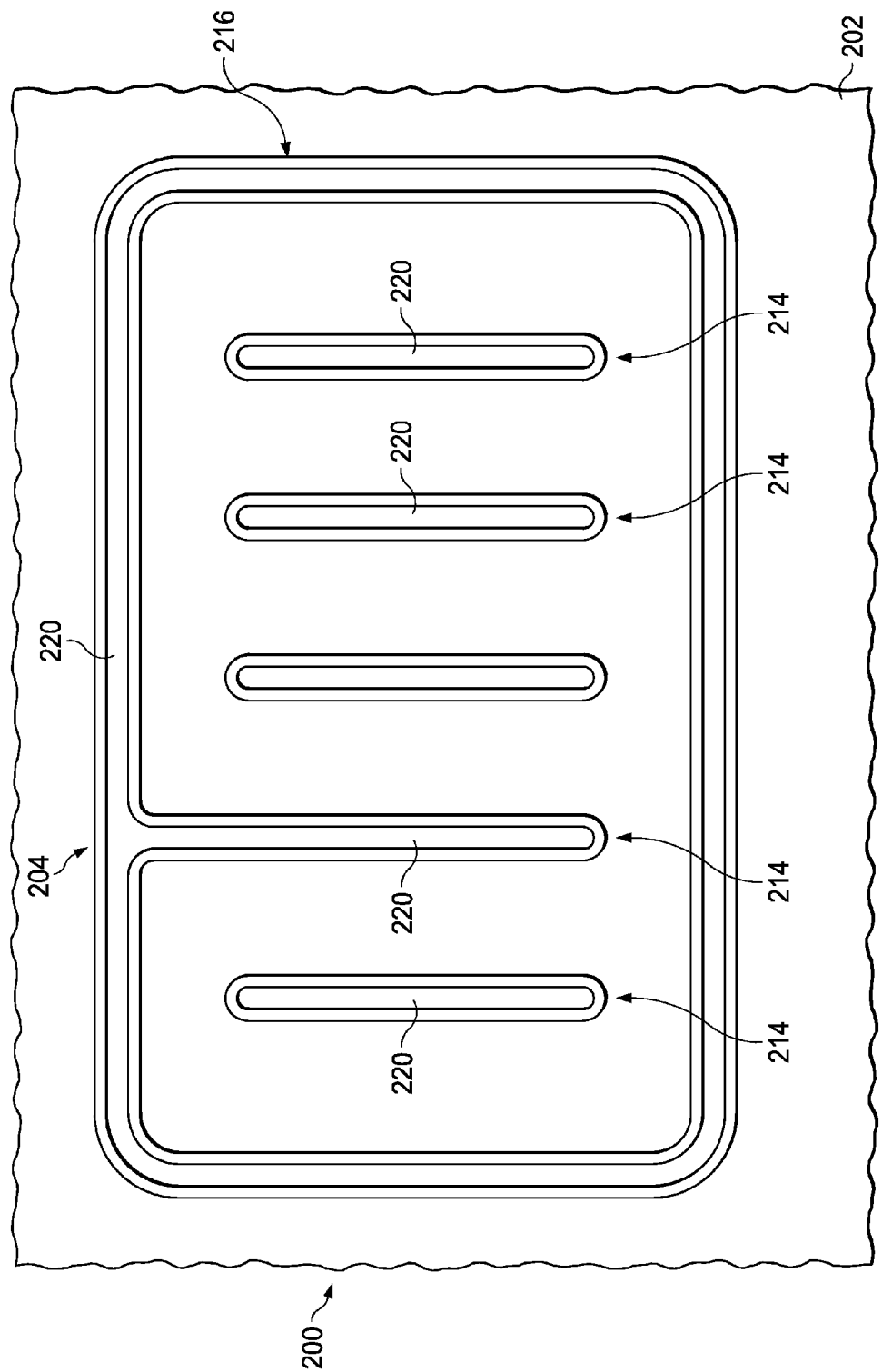
FIG. 2A through FIG. 2F are top views of a semiconductor device containing a medium voltage MOSFET, for example as described in reference to FIG. 1A through FIG. 1P, depicted in successive stages of fabrication.

FIG. 2A through FIG. 2F are top views of a semiconductor device containing a medium voltage MOSFET, for example as described in reference to FIG. 1A through FIG. 1P, depicted in successive stages of fabrication. Referring to FIG. 2A, the semiconductor device 200 is formed in and on a semiconductor substrate 202. The medium voltage MOSFET 204 contains transistor RESURF trenches 214. A perimeter RESURF trench 216 surrounds the medium voltage MOSFET 204. The transistor RESURF trenches 214 and the perimeter RESURF trench 216 contain RESURF field plates 220. In the instant example, the perimeter RESURF trench 216 is connected to at least one instance of the transistor RESURF trenches 214 so that the RESURF field plate 220 in the perimeter RESURF trench 216 is electrically connected to the RESURF field plate 220 in the at least one transistor RESURF trench 214.

Figure 2B:
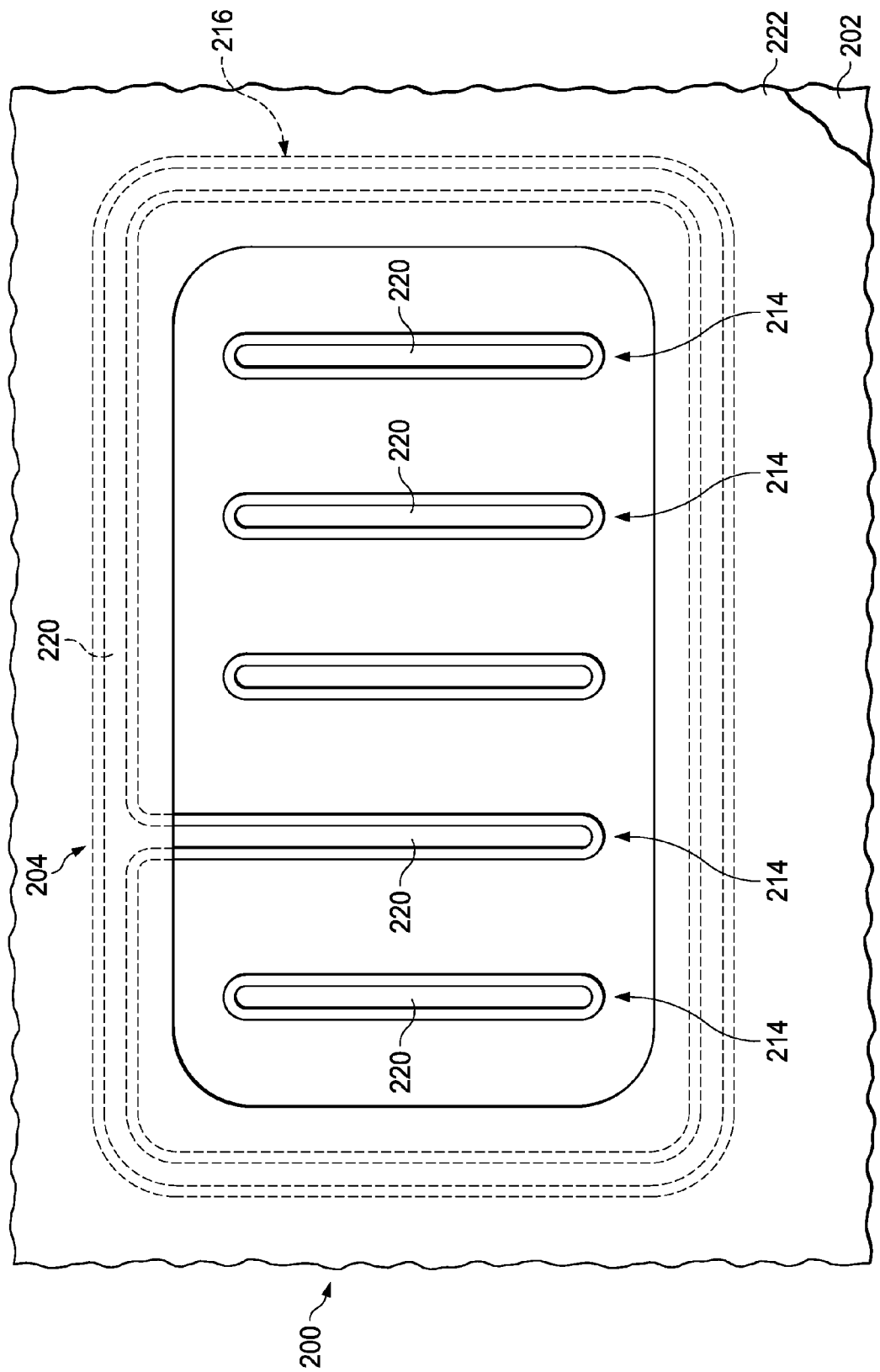

Referring to FIG. 2B, a drain dielectric layer 222 is formed over the substrate 202 overlapping the perimeter RESURF trench 216. The drain dielectric layer 222 has a sloped profile as described in reference to FIG. 1E. Forming the perimeter RESURF trench 216 to be connected to at least one instance of the transistor RESURF trenches 214 allows the drain dielectric layer 222 to overlap the perimeter RESURF trench 216, advantageously allowing a higher operating voltage on the medium voltage MOSFET 204.

Figure 2C:
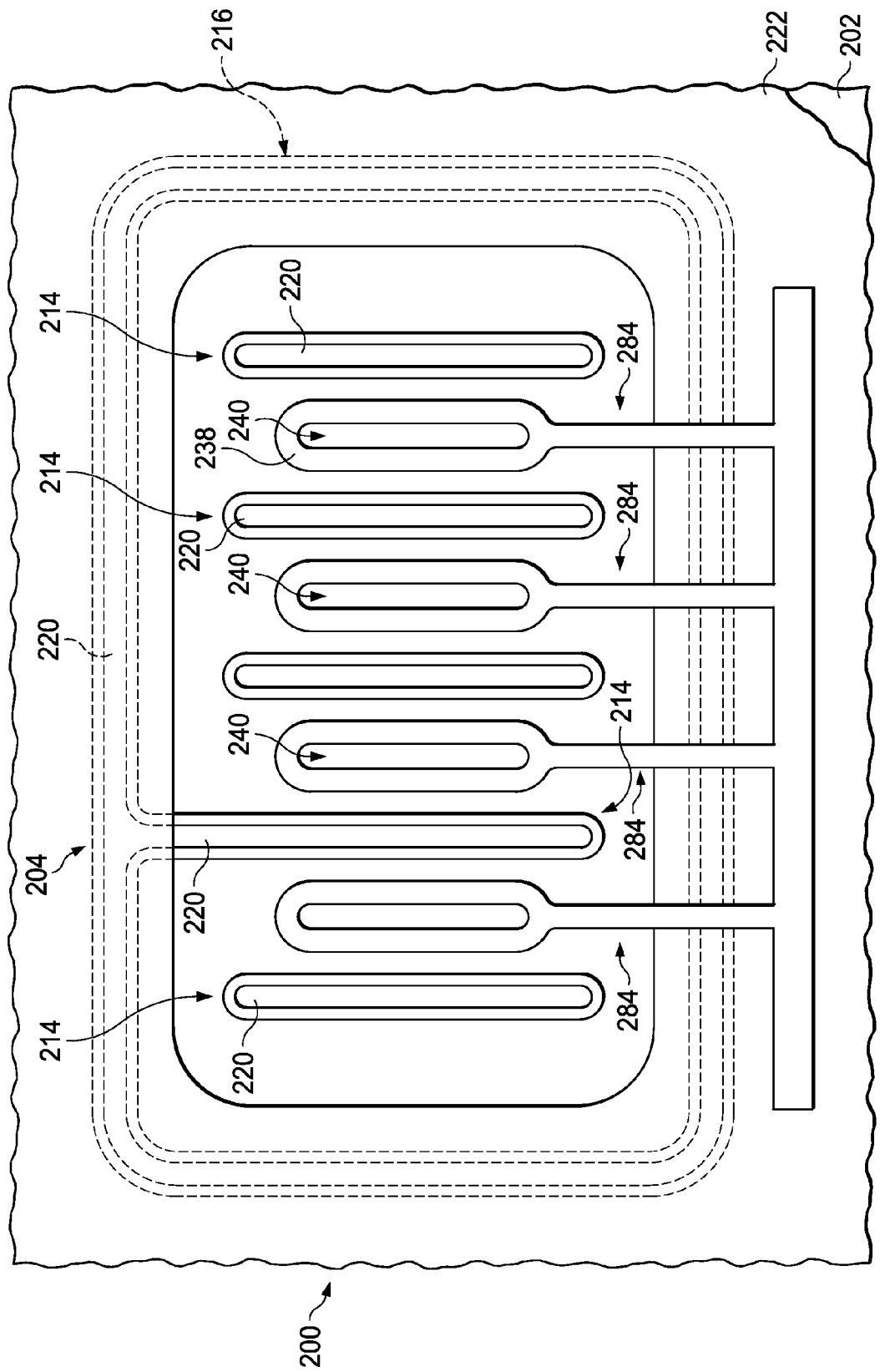

Referring to FIG. 2C, a split gate 238 is formed over the substrate 202 between the transistor RESURF trenches 214 and overlapping the drain dielectric layer 222. Forming the sloped profile in the drain dielectric layer 222 advantageously enables a link portion 284 of the split gate 238 which traverses the sloped profile to be sufficiently narrow so that p-type dopants of a body implant diffuse under the link portion 284 and form a continuous p-type body region in the medium voltage MOSFET 204. The split gate 238 is recessed from edges of the transistor RESURF trenches 214, and has central openings 240 in a central area between the transistor RESURF trenches 214.

Figure 2D:
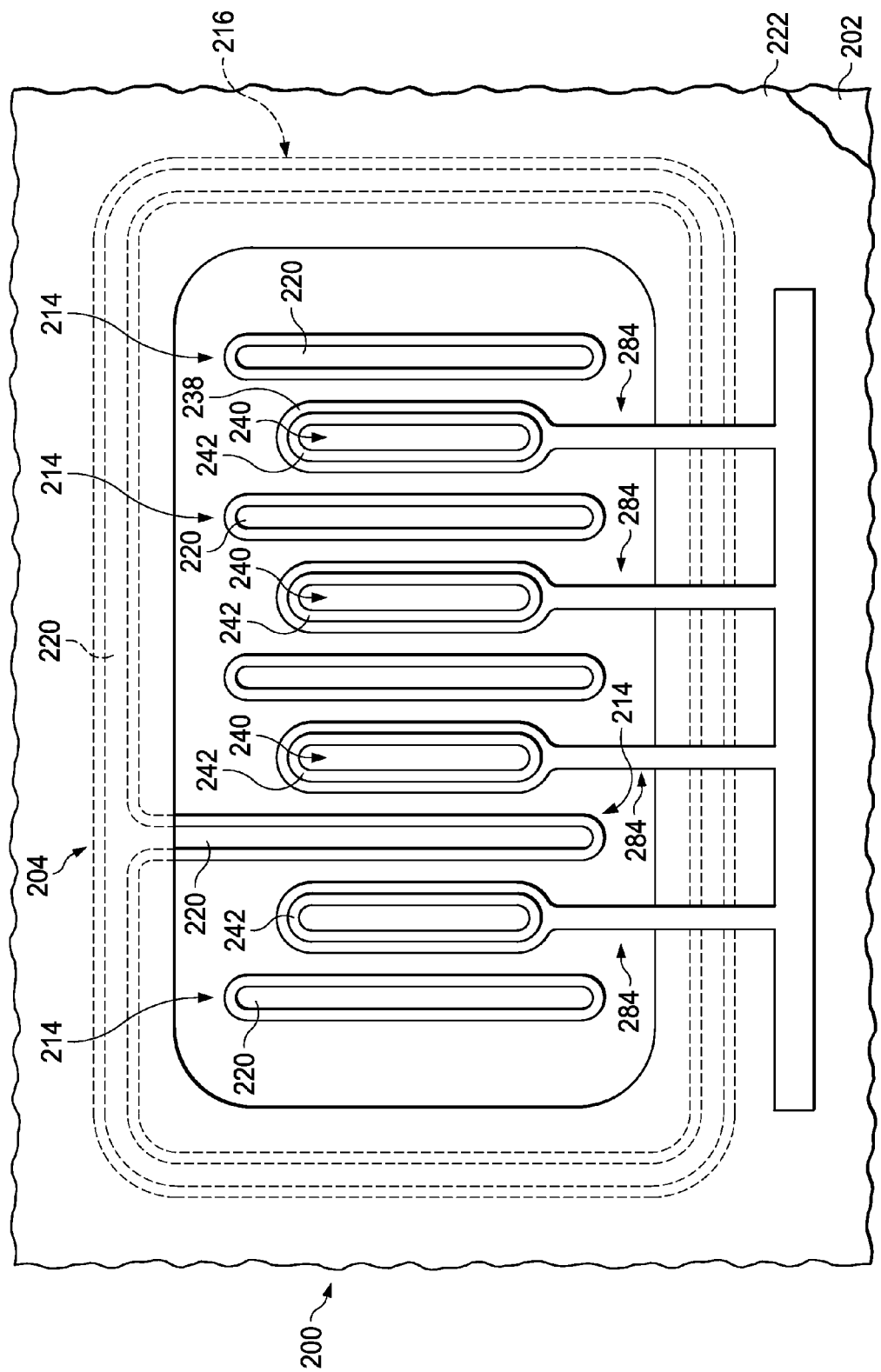

Referring to FIG. 2D, a body implant mask 242 is formed over the central openings 240 of the split gate 238 in the central area between the transistor RESURF trenches 214. The body implant mask 242 is depicted in FIG. 2D with a stipple fill pattern to illustrate boundaries with respect to the split gate 238. P-type dopants are implanted into the substrate 202 in areas exposed by the body implant mask 242 and annealed to form a p-type body region, as described in reference to FIG. 1H and FIG. 1I.

Figure 2E:
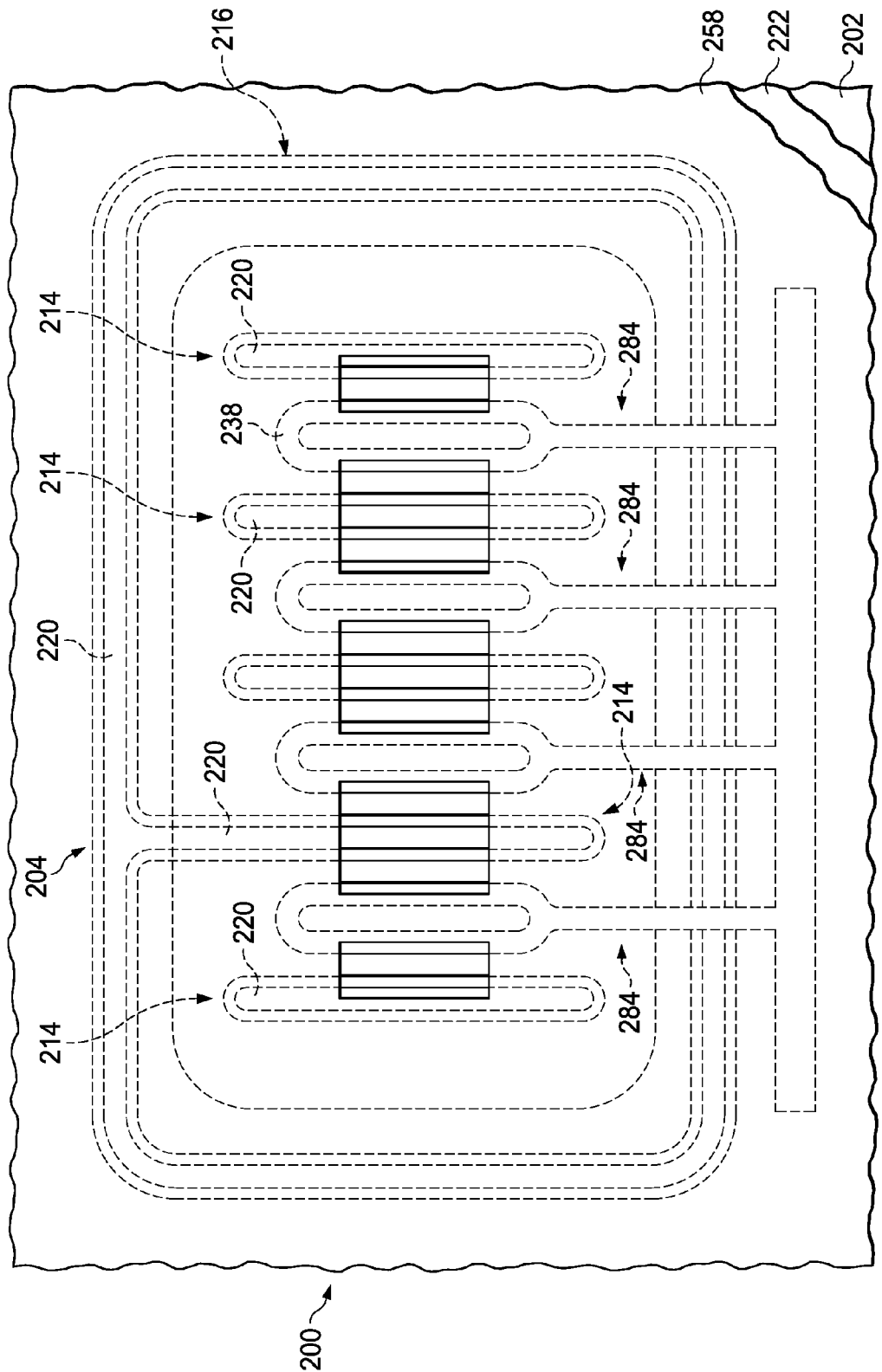

Referring to FIG. 2E, a source implant mask 258 is formed to expose areas for source regions between the split gate 238 and the transistor RESURF trenches 214. The source implant mask 258 is depicted in FIG. 2E with a stipple fill pattern to illustrate boundaries with respect to the split gate 238. N-type dopants and p-type dopants are implanted into the substrate 202 in areas exposed by the source implant mask 258 and annealed to form source regions and body contact regions, respectively, as described in reference to FIG. 1M.

Figure 2F:
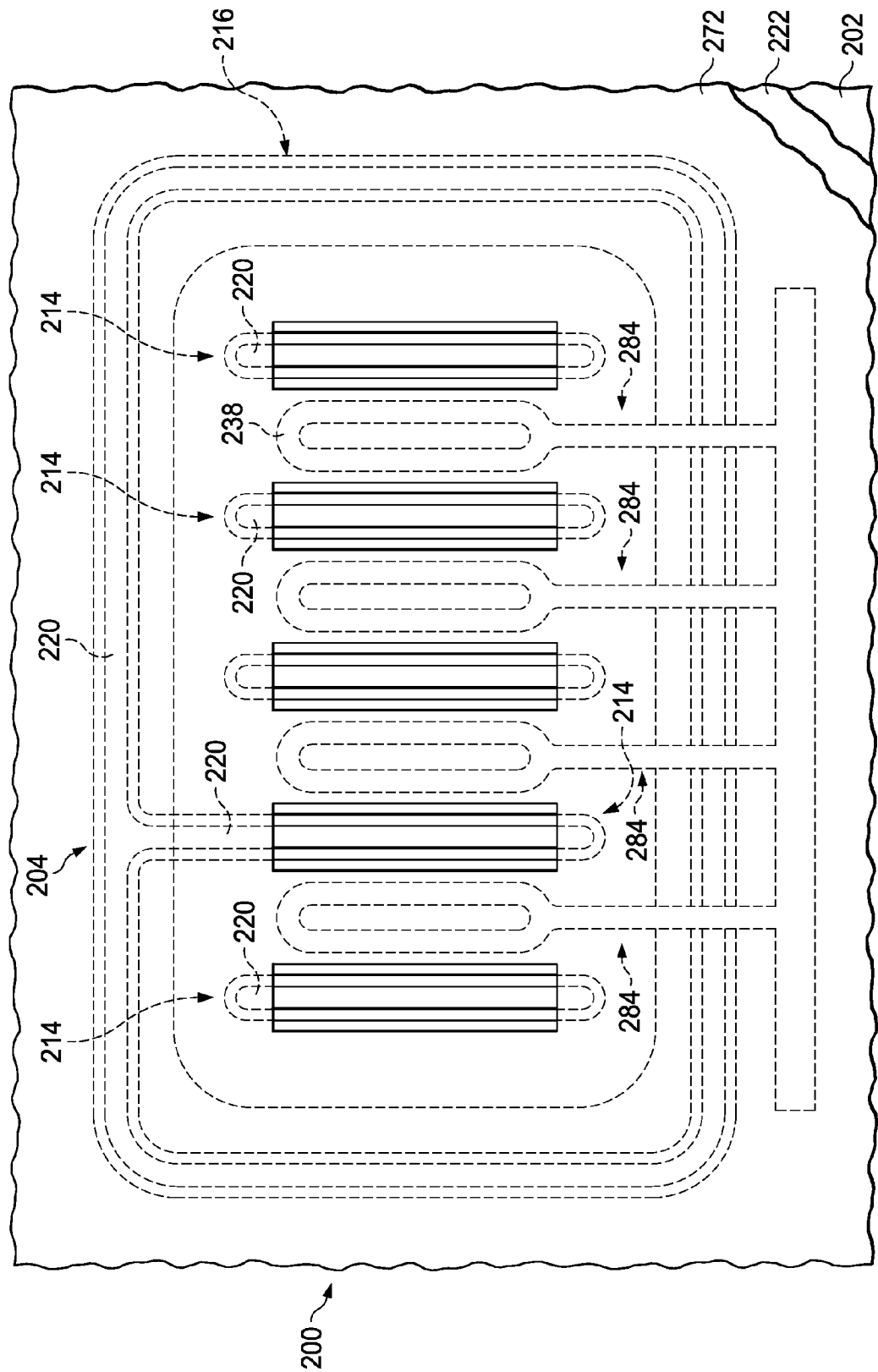

Referring to FIG. 2F, source-contact etch mask 272 is formed which exposes regions along the transistor RESURF trenches 214 and portions of the substrate 202 immediately abutting the transistor RESURF trenches 214. The source-contact etch mask 272 is depicted in FIG. 2F with a stipple fill pattern to illustrate boundaries with respect to the split gate 238. A source contact etch process forms source-contact trenches as described in reference to FIG. 1O.

Figure 3A:
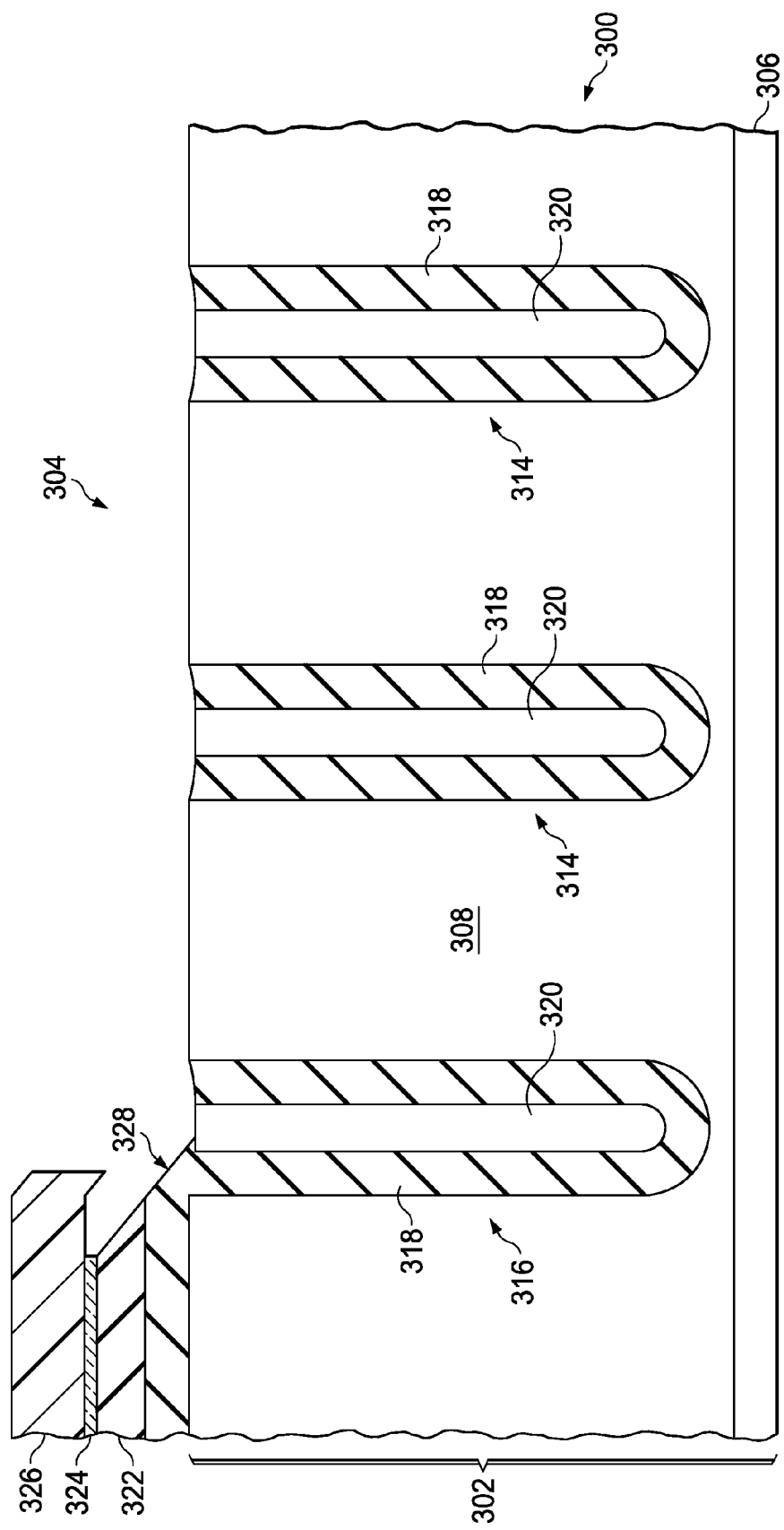
FIG. 3A through FIG. 3F are cross sections of another semiconductor device containing a different medium voltage MOSFET, depicted in successive stages of fabrication.

FIG. 3A through FIG. 3F are cross sections of another semiconductor device containing a different medium voltage MOSFET, depicted in successive stages of fabrication. Referring to FIG. 3A, the semiconductor device 300 is formed in and on a semiconductor substrate 302, with an n-type drain contact region 306 of a medium voltage MOSFET 304 formed 4 to 8 microns below a top surface of the substrate 302 and an n-type drift region 308 formed over the drain contact region 306, extending to the top surface of the substrate 302, as described in reference to FIG. 1A.

Transistor RESURF trenches 314 and a perimeter RESURF trench 316 are concurrently formed in the drift region 308, with trench liners 318 and RESURF field plates 320, as described in reference to FIG. 1A through FIG. 1C. A drain dielectric layer 322 and possibly an optional layer of phosphosilicate glass 324 are formed over a top surface of the semiconductor device 300 and patterned with the trench liners 318 using an etch mask 326 so that an edge 328 of the drain dielectric layer 322 and the trench liner 318 has a sloped profile of, for example, 30 degrees to 60 degrees, as described in reference to FIG. 1D and FIG. 1E. Top surface of the trench liners 318 are approximately coplanar with the top surfaces of the corresponding RESURF field plates 320. In the instant example, the RESURF field plates 320 in both the transistor RESURF trenches 314 and the perimeter RESURF trench 316 are exposed after the drain dielectric layer 322 and the trench liners 318 are patterned.

Figure 3B:
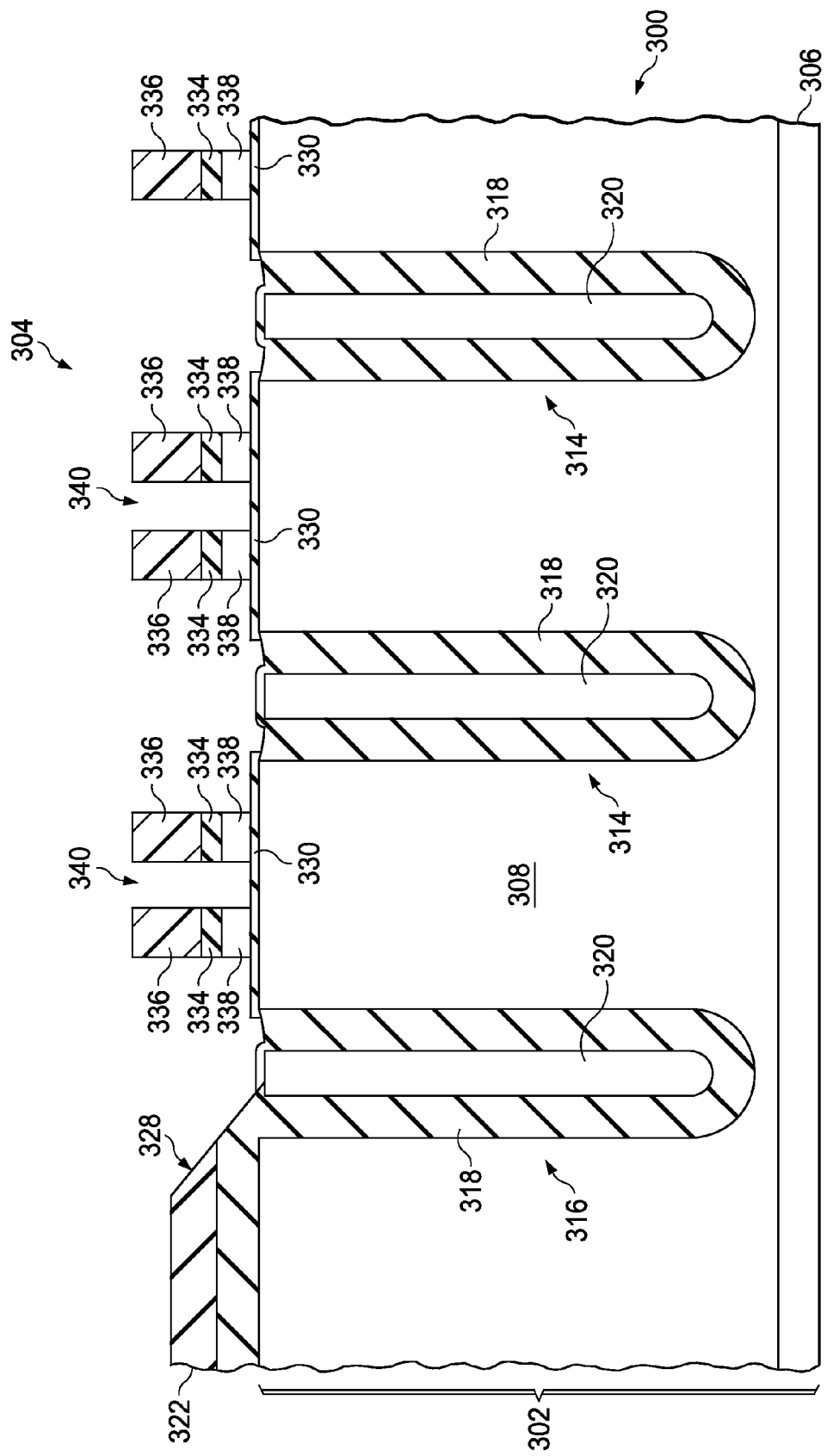

Referring to FIG. 3B, a gate dielectric layer 330 is formed on the top surface of the substrate 302 as described in reference to FIG. 1F. A split gate 338 with a central opening 340 and cap dielectric layer 334 are formed using a gate etch mask 336, as described in reference to FIG. 1F and FIG. 1G. In the instant embodiment, the split gate 338 is formed over the drift region 308 between the transistor RESURF trenches 314 and between the transistor RESURF trenches 314 and the perimeter RESURF trench 316.

Figure 3C:
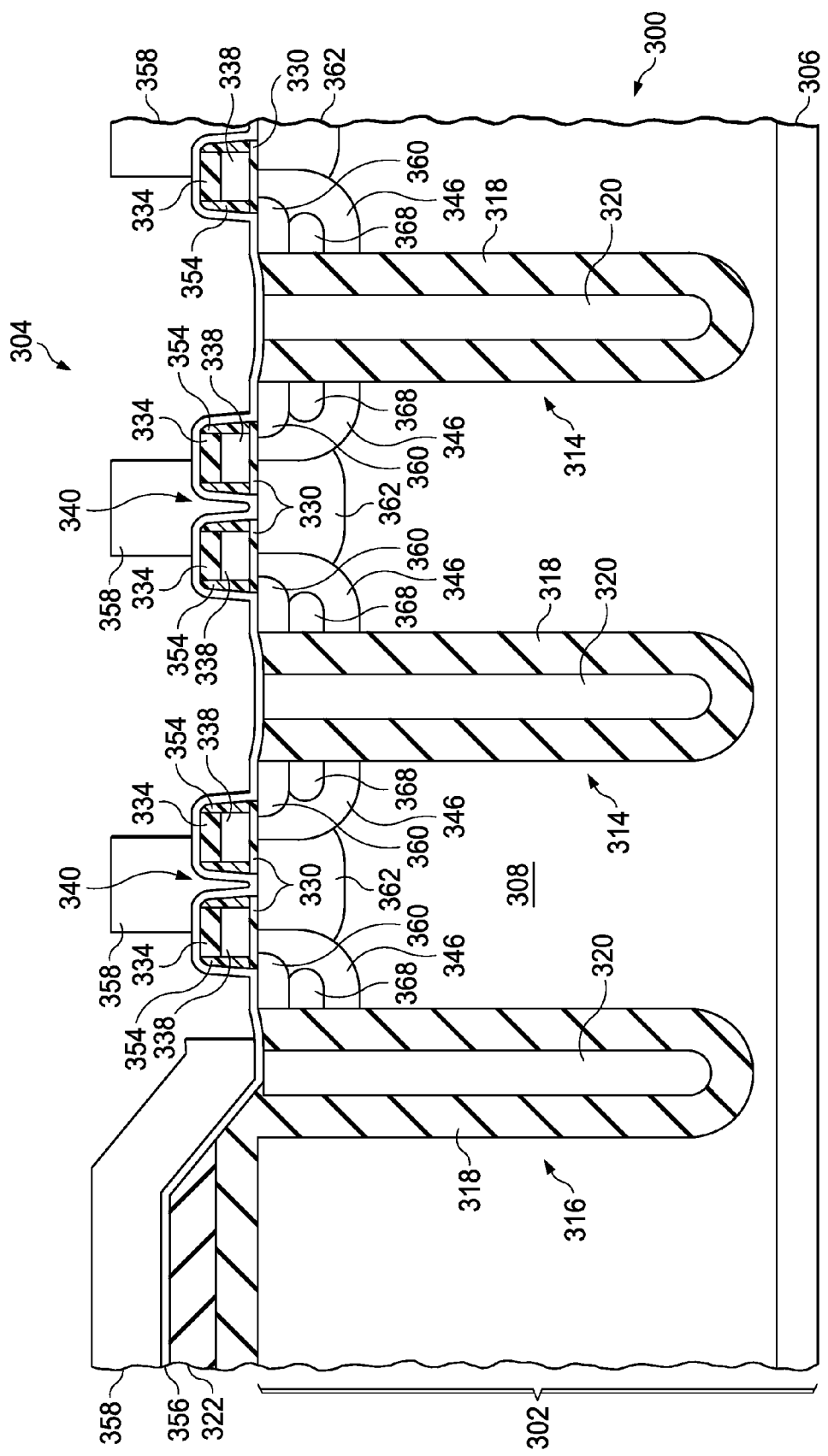

Referring to FIG. 3C, a body region 346 abutting the transistor RESURF trenches 314 and the perimeter RESURF trench 316, extending partway under the split gate 338, is formed as described in reference to FIG. 1H and FIG. 1I. An n-type two-level LDD implanted region is formed under the central opening 340 in the split gate 338 by a two-step blanket implant as described in reference to FIG. 1J. Gate sidewall spacers 354 are formed on lateral surfaces of the split gate 338 as described in reference to FIG. 1K. A screen oxide layer 356 is formed with a stress less that 100 megapascals (MPa) is formed over an existing top surface of the semiconductor device 300, as described in reference to FIG. 1L.

A source implant mask 358 is formed over the central opening 340 in the split gate 338. N-type dopants are implanted into the substrate adjacent to the split gate 338 to form source implanted regions. P-type dopants are implanted to form body contact implanted regions under the source implanted regions. The source implant mask 358 is removed, and a source anneal operation forms n-type source regions 360, an n-type two-level LDD region 362 and p-type body contact regions 368, as described in FIG. 1M.

Figure 3D:
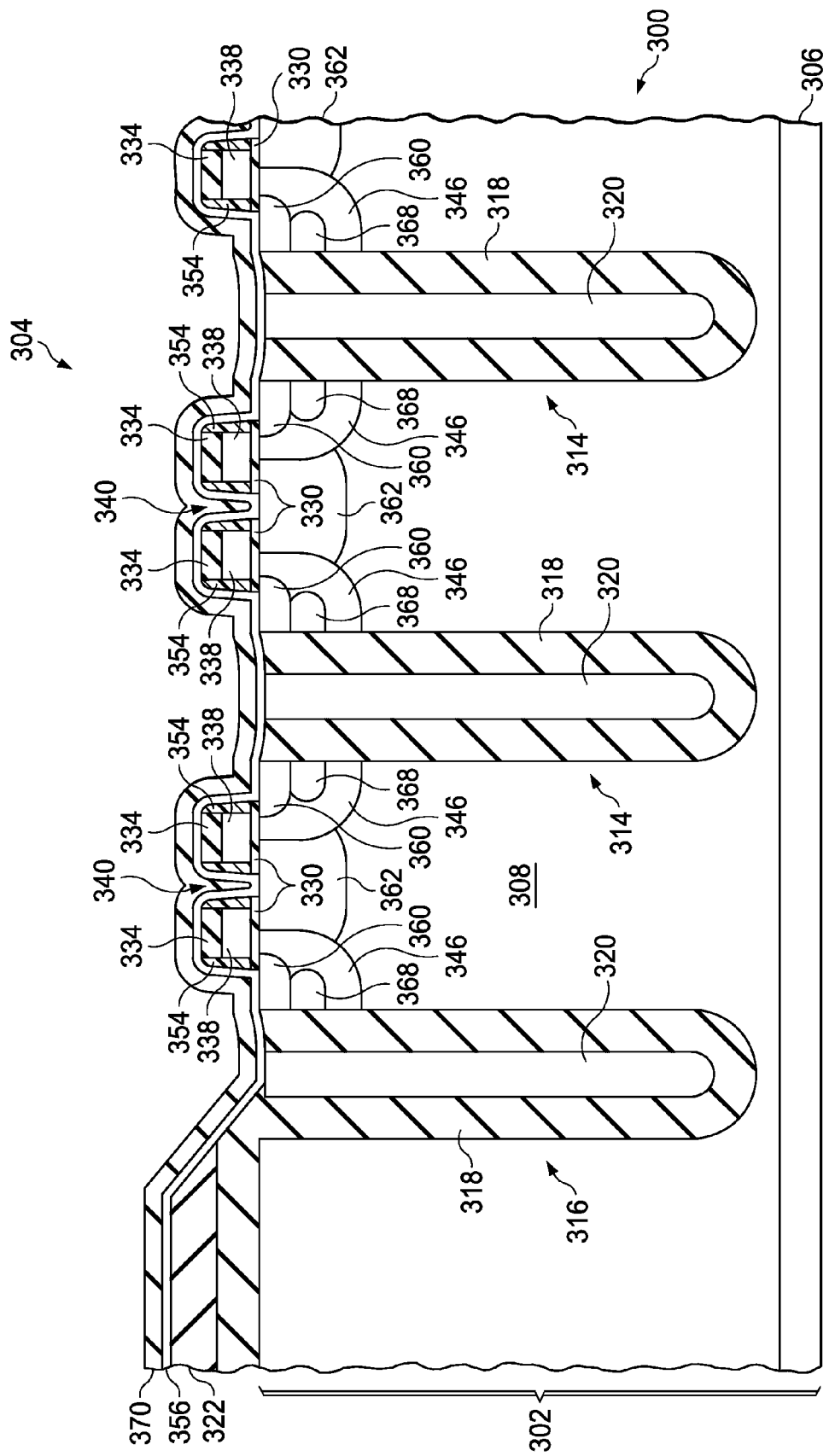
Figure 3E:
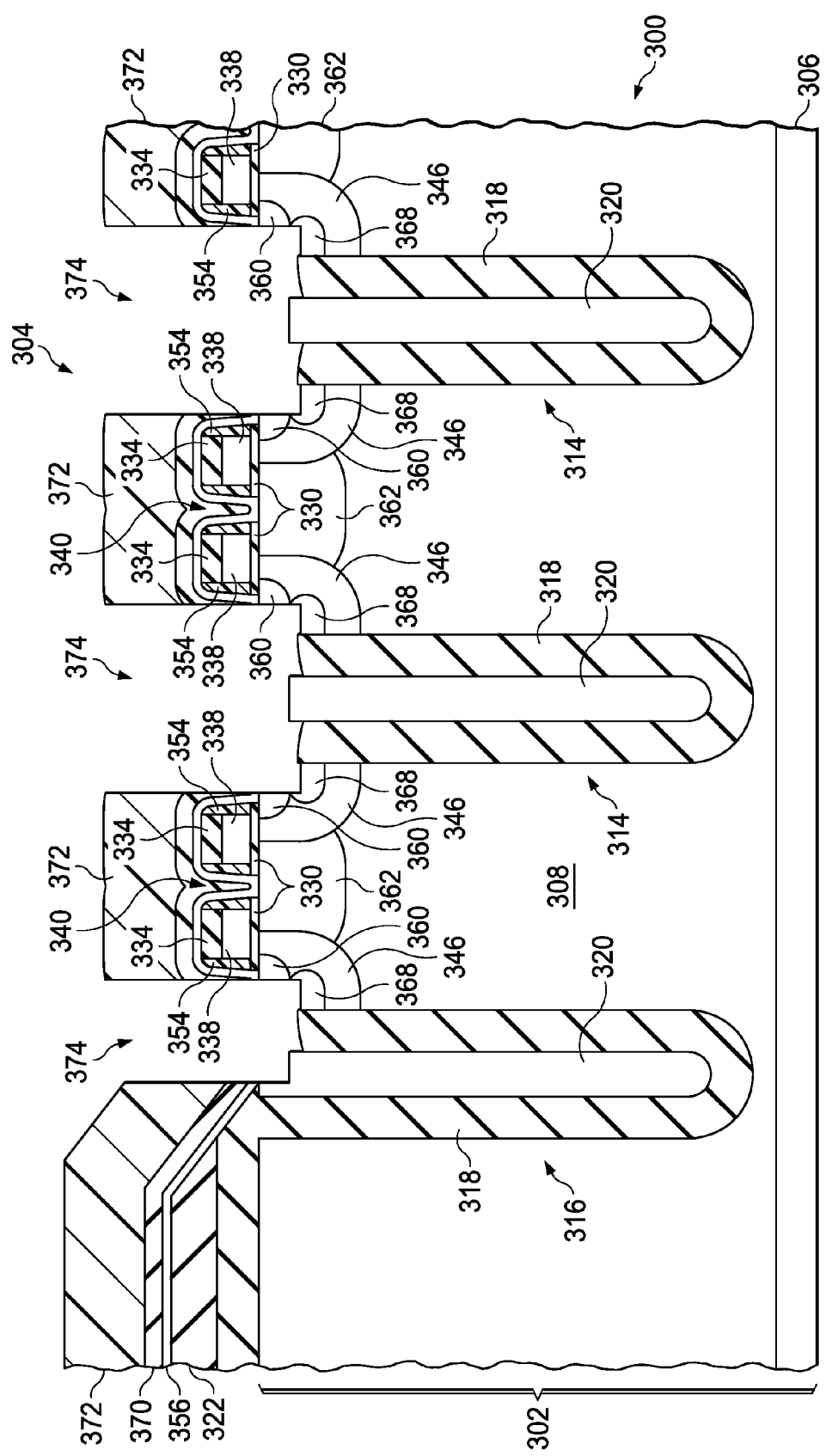

Referring to FIG. 3D, a PMD layer 370 is formed over an existing top surface of the semiconductor device 300, as described in reference to FIG. 1N. Referring to FIG. 3E, a source-contact etch mask 372 is formed over the PMD layer 370. Source-contact trenches 374 are formed which extend 200 nanometers to 400 nanometers below the top surface of the substrate 302 and expose the source regions 360 on sides of the source-contact trenches 374 and expose the body contact regions 368 and the RESURF field plates 320 on bottoms of the source-contact trenches 374, as described in reference to FIG. 1O.

Figure 3F:
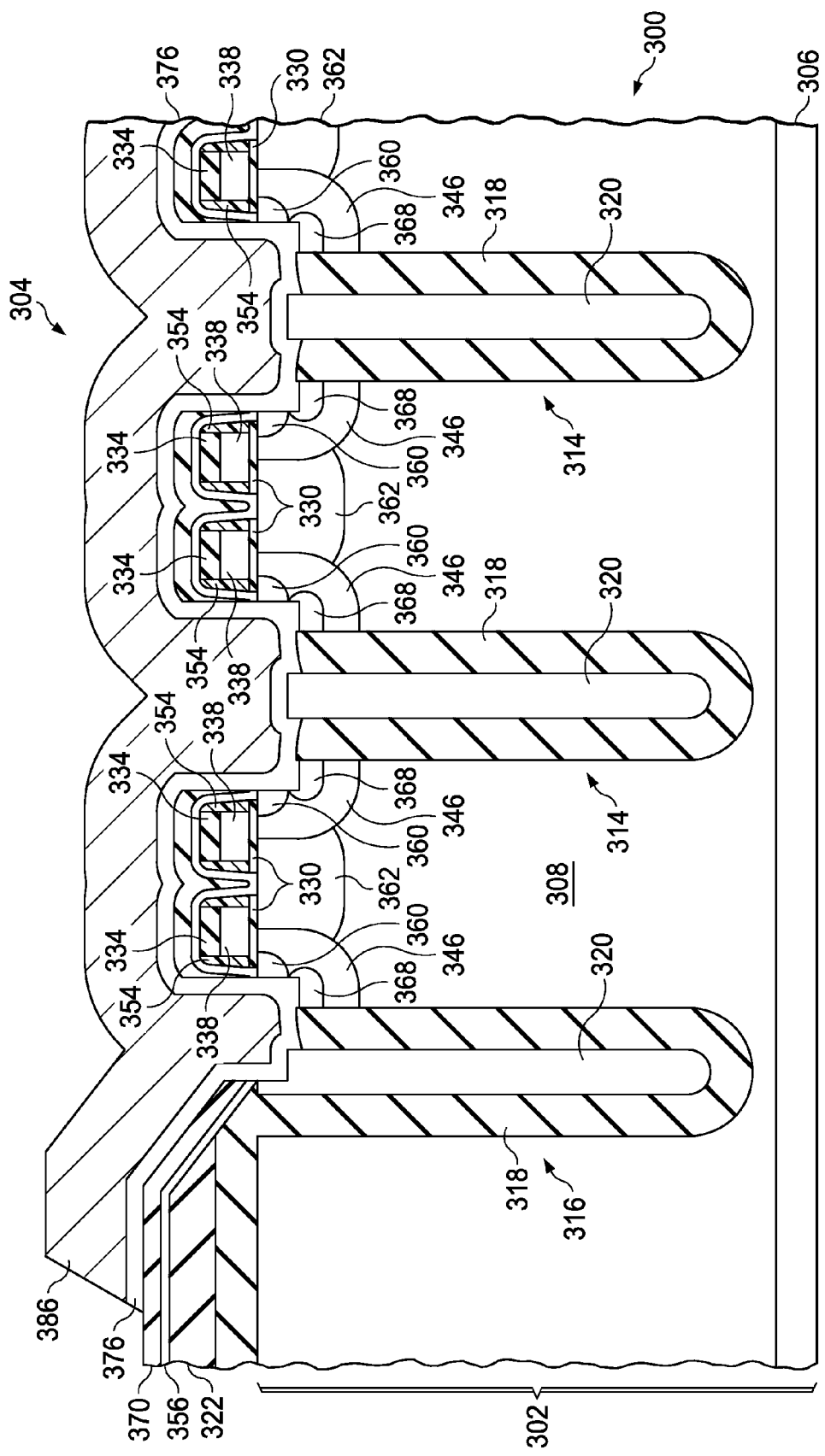

Referring to FIG. 3F, a contact metal stack 376 is formed on the semiconductor device 300 contacting the source regions 360, the body contact regions 368 and the RESURF field plates 320, for example as described in reference to the contact metal stack 176 of FIG. 1P. A source metal layer 386 formed on the contact metal stack 376 to cover the split gate 338. Forming the medium voltage MOSFET 304 to provide transistor functionality between the transistor RESURF trenches 314 and the perimeter RESURF trench 316 may advantageously reduce an area required for the medium voltage MOSFET 304 for a desired value of on-state resistance.

Figure 4A:
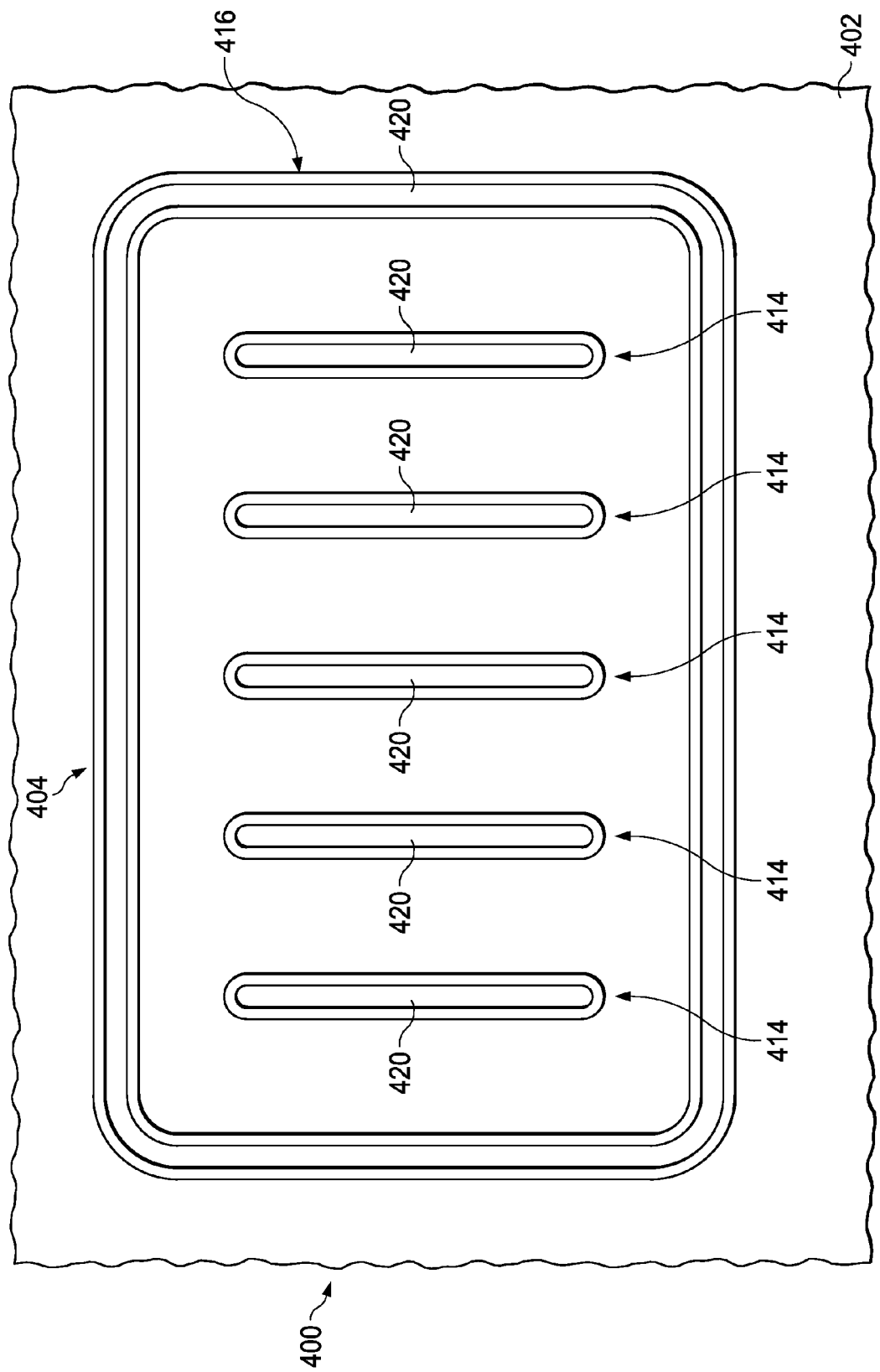
FIG. 4A through FIG. 4F are top views of a semiconductor device containing a medium voltage MOSFET, for example as described in reference to FIG. 3A through FIG. 3F, depicted in successive stages of fabrication.

FIG. 4A through FIG. 4F are top views of a semiconductor device containing a medium voltage MOSFET, for example as described in reference to FIG. 3A through FIG. 3F, depicted in successive stages of fabrication. Referring to FIG. 4A, the semiconductor device 400 is formed in and on a semiconductor substrate 402. The medium voltage MOSFET 404 contains transistor RESURF trenches 414. A perimeter RESURF trench 416 surrounds the medium voltage MOSFET 404. The transistor RESURF trenches 414 and the perimeter RESURF trench 416 contain RESURF field plates 420. In the instant example, the perimeter RESURF trench 416 is not connected to the transistor RESURF trenches 414, so that the perimeter RESURF trench 416 and the transistor RESURF trenches 414 are free of T-shaped intersections, which may advantageously increase a process margin for forming the RESURF field plates 420 by eliminating difficult-to-fill geometries associated with T-shaped intersections.

Figure 4B:
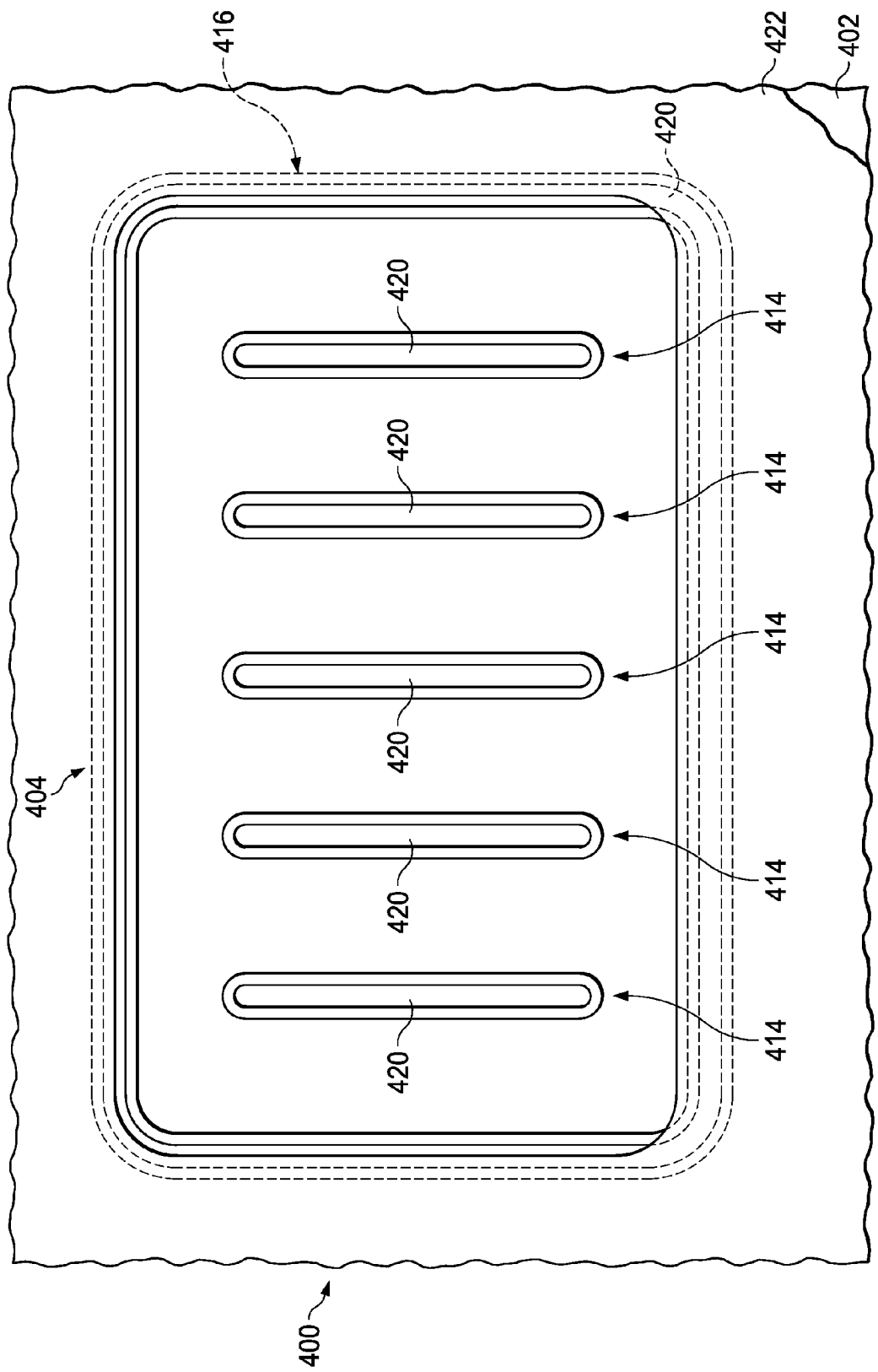

Referring to FIG. 4B, a drain dielectric layer 422 is formed over the substrate 402 overlapping the perimeter RESURF trench 416. The drain dielectric layer 422 has a sloped profile as described in reference to FIG. 3A. In the instant example, the drain dielectric layer 422 exposes at least a portion of the RESURF field plate 420 in the perimeter RESURF trench 416. The drain dielectric layer 422 may overlap a portion of the RESURF field plate 420 in the perimeter RESURF trench 416 to provide a path for a subsequently formed gate link portion to traverse the sloped profile of the drain dielectric layer 422 without contacting the RESURF field plate 420 in the perimeter RESURF trench 416.

Figure 4C:
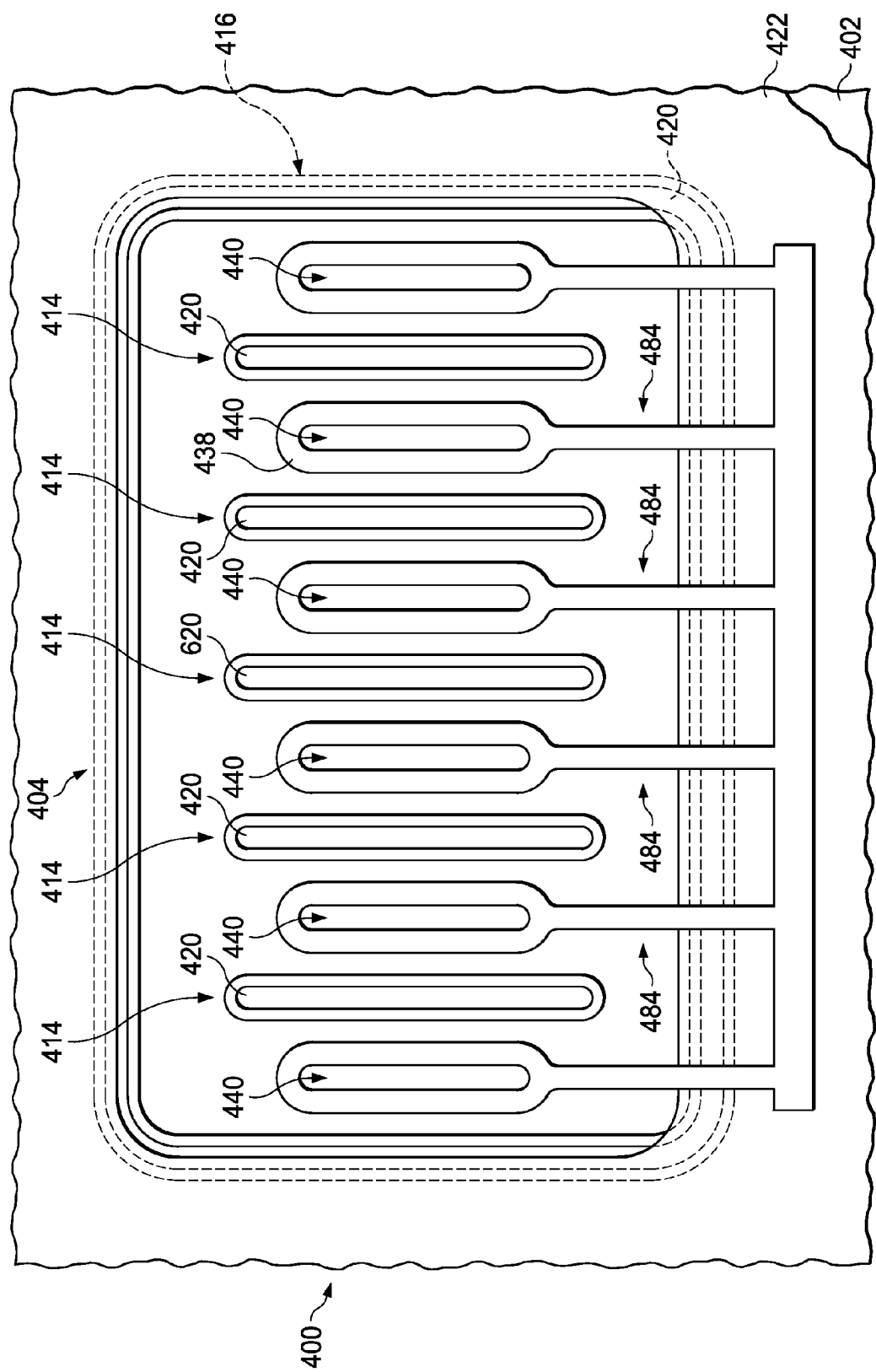

Referring to FIG. 4C, a split gate 438 is formed over the substrate 402 between the transistor RESURF trenches 414 and overlapping the drain dielectric layer 422. The split gate 438 traverses the sloped profile of the drain dielectric layer 422 with link portions 484 where the drain dielectric layer 422 overlaps the RESURF field plate 420 in the perimeter RESURF trench 416. The split gate 438 is recessed from edges of the transistor RESURF trenches 414 and the perimeter RESURF trench 416, and has central openings 440 in central areas between the transistor RESURF trenches 414 and between the outer transistor RESURF trenches 414 and the perimeter RESURF trench 416.

Figure 4D:
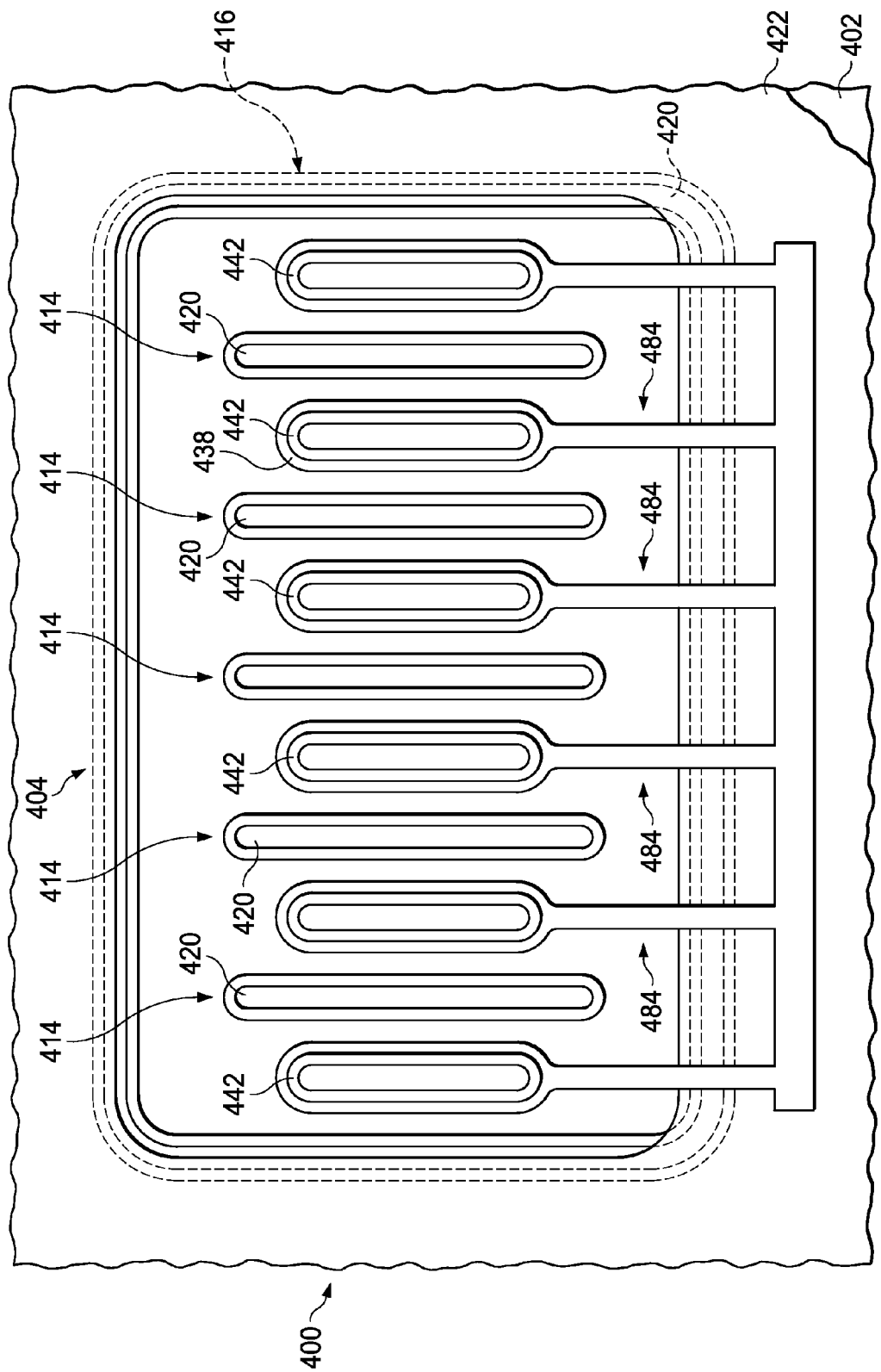

Referring to FIG. 4D, a body implant mask 442 is formed over the central openings 440 of the split gate 438 in the central area between the transistor RESURF trenches 414. The body implant mask 442 is depicted in FIG. 4D with a stipple fill pattern to illustrate boundaries with respect to the split gate 438. P-type dopants are implanted into the substrate 402 in areas exposed by the body implant mask 442 and annealed to form a p-type body region, as described in reference to FIG. 1H and FIG. 1I.

Figure 4E:
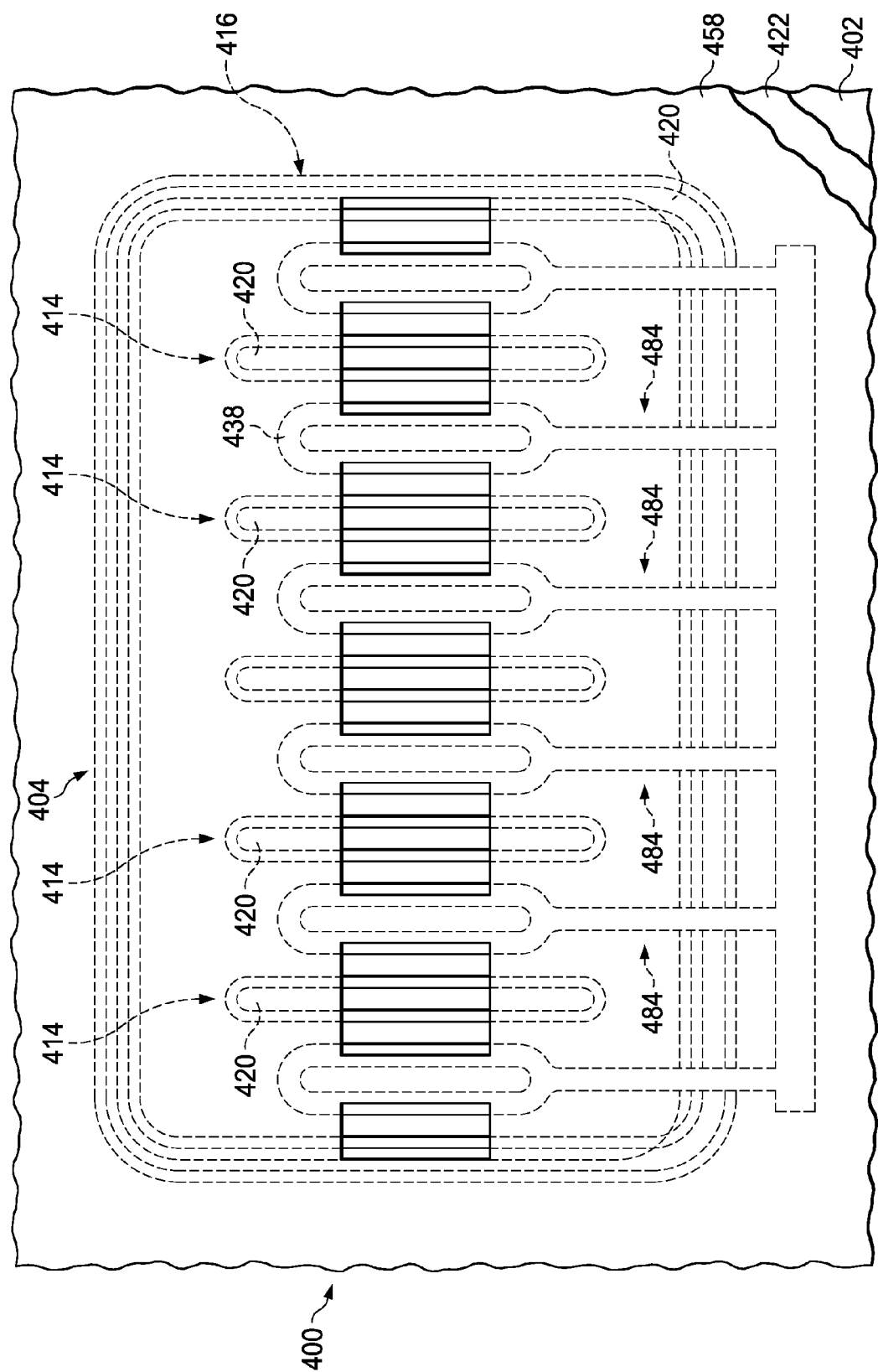

Referring to FIG. 4E, a source implant mask 458 is formed to expose areas for source regions between the split gate 438 and the transistor RESURF trenches 414 and the perimeter RESURF trench 416. The source implant mask 458 is depicted in FIG. 4E with a stipple fill pattern to illustrate boundaries with respect to the split gate 438. N-type dopants and p-type dopants are implanted into the substrate 402 in areas exposed by the source implant mask 458 and annealed to form source regions and body contact regions, respectively, as described in reference to FIG. 1M.

Figure 4F:
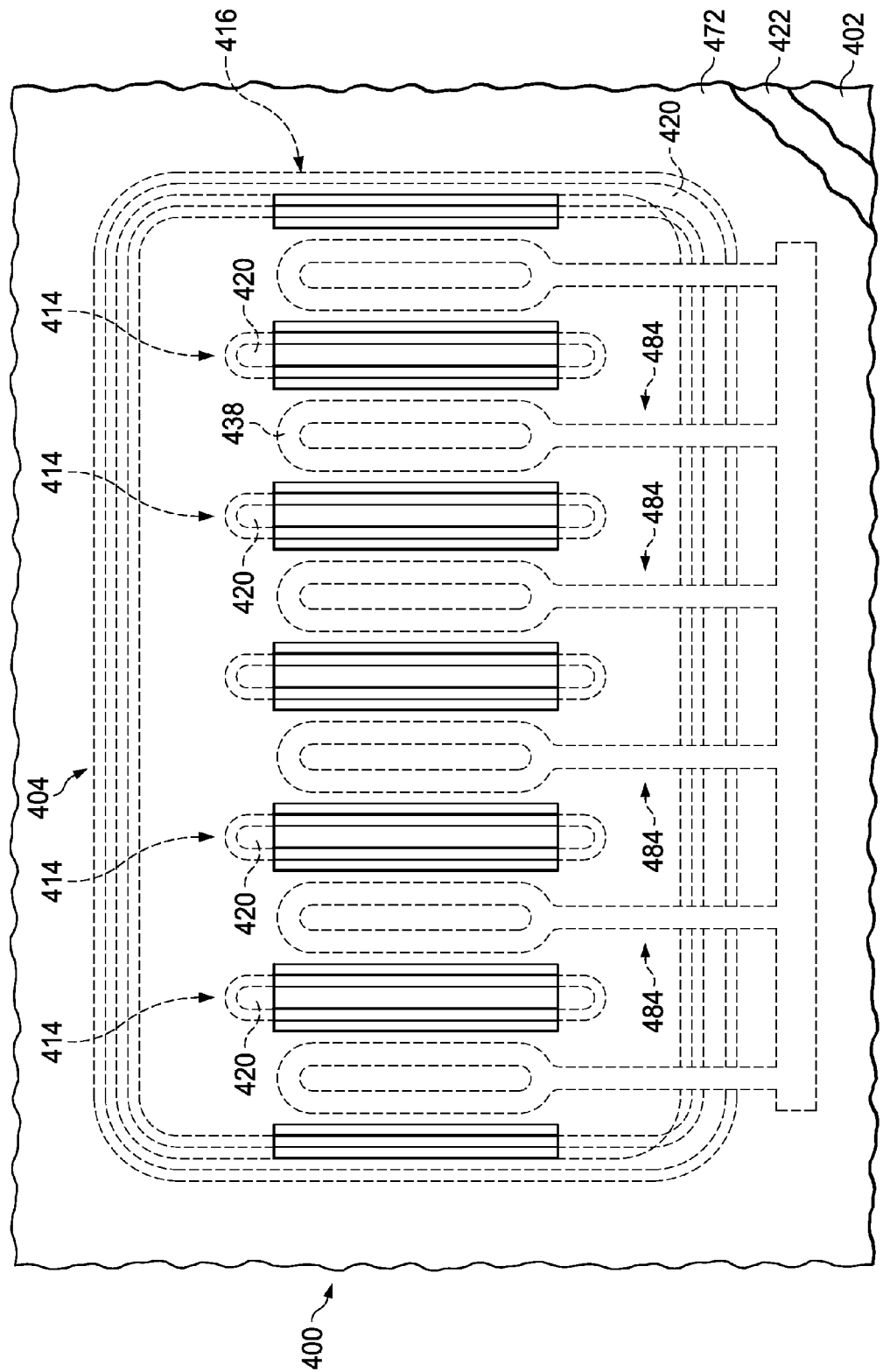

Referring to FIG. 4F, source-contact etch mask 472 is formed which exposes regions along the transistor RESURF trenches 414 and the perimeter RESURF trench 416, and portions of the substrate 402 immediately abutting the transistor RESURF trenches 414 and the perimeter RESURF trench 416. The source-contact etch mask 472 is depicted in FIG. 4F with a stipple fill pattern to illustrate boundaries with respect to the split gate 438. A source contact etch process forms source-contact trenches as described in reference to FIG. 1O.

Figure 5A:
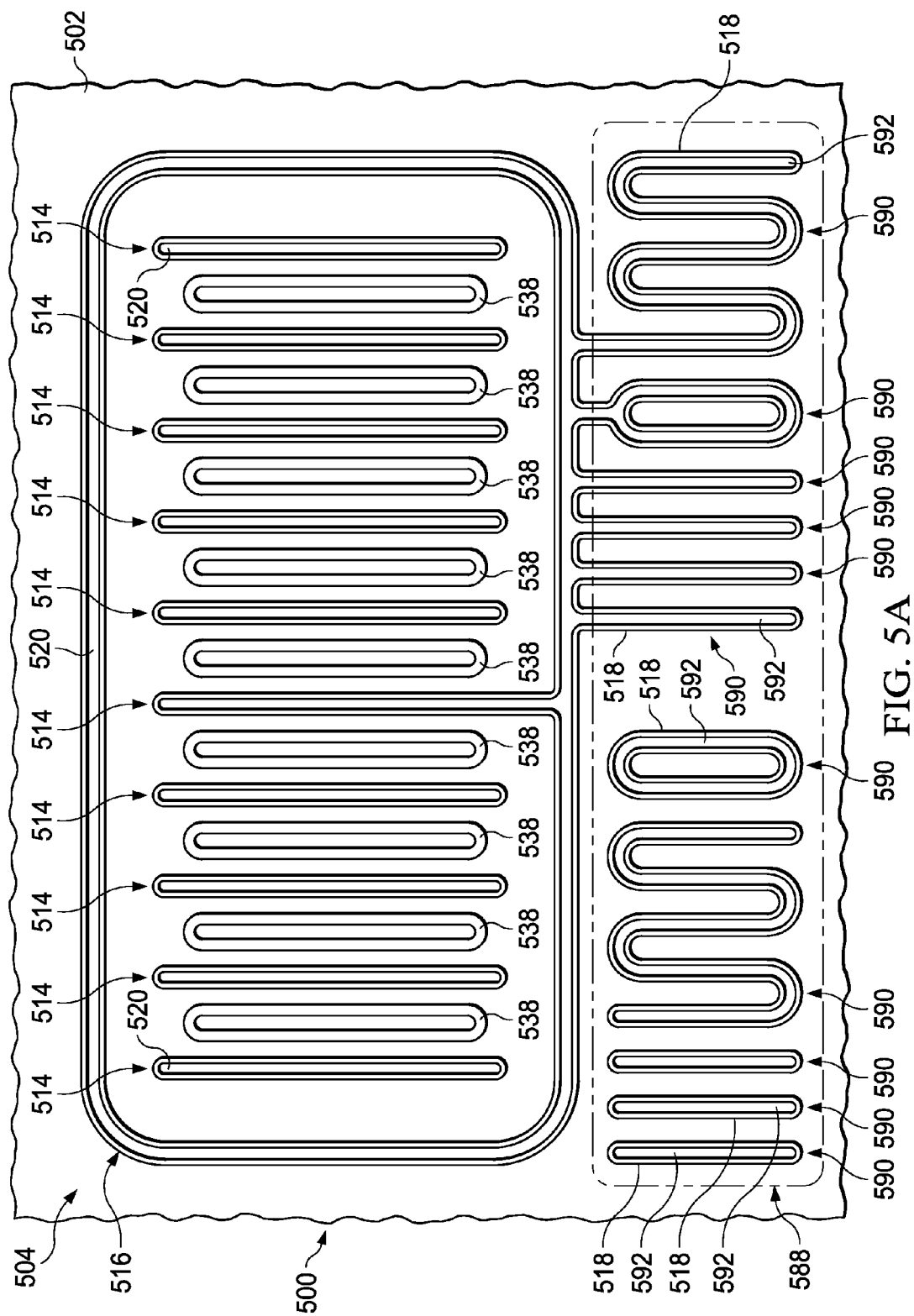
FIG. 5A is a top view of a semiconductor device containing a medium voltage MOSFET with an integrated snubber, depicting an exemplary configuration of transistor RESURF trenches, a perimeter RESURF trench and snubber trenches.

FIG. 5A is a top view of a semiconductor device containing a medium voltage MOSFET with an integrated snubber, depicting an exemplary configuration of transistor RESURF trenches, a perimeter RESURF trench and snubber trenches. The semiconductor device 500 is formed in and on a substrate 502 which includes an n-type semiconductor drain contact region and an n-type drain drift region over the drain contact region, as described in reference to FIG. 1A. The semiconductor device 500 includes the medium voltage MOSFET 504 with transistor RESURF trenches 514 and a perimeter RESURF trench 516 and a split gate 538 between the transistor RESURF trenches 514. The medium voltage MOSFET 504 may have a configuration as described in reference to FIG. 2A or FIG. 4A, or another configuration. The semiconductor device 500 further includes an integrated snubber 588. A drain dielectric layer, connecting links of the split gate 538 and other elements of the medium voltage MOSFET 504 are not depicted in FIG. 5A through FIG. 5E in order to more clearly show the configuration of the integrated snubber 588. The integrated snubber 588 includes one or more snubber trenches 590 formed concurrently with the transistor RESURF trenches 514 and the perimeter RESURF trench 516. Each snubber trench 590 includes a trench liner 518 and a snubber capacitor plate 592 formed on the trench liner 518 concurrently with the RESURF field plates 520 in the transistor RESURF trenches 514 and the perimeter RESURF trench 516. The snubber trenches 590 may have linear, closed loop, serpentine or other configuration, The snubber trenches 590 may be connected to the perimeter RESURF trench 516 and/or the transistor RESURF trenches 514, or may be isolated. The snubber trenches 590 may be located outside of the perimeter RESURF trench 516 as depicted in FIG. 5A, or may have a portion or all located inside the perimeter RESURF trench 516. An area of the integrated snubber 588 may be, for example, at least 5 percent of an area of the medium voltage MOSFET 504. In another instance of the semiconductor device 500, the area of the integrated snubber 588 may be at least 25 percent of an area of the medium voltage MOSFET 504.

Figure 5B:
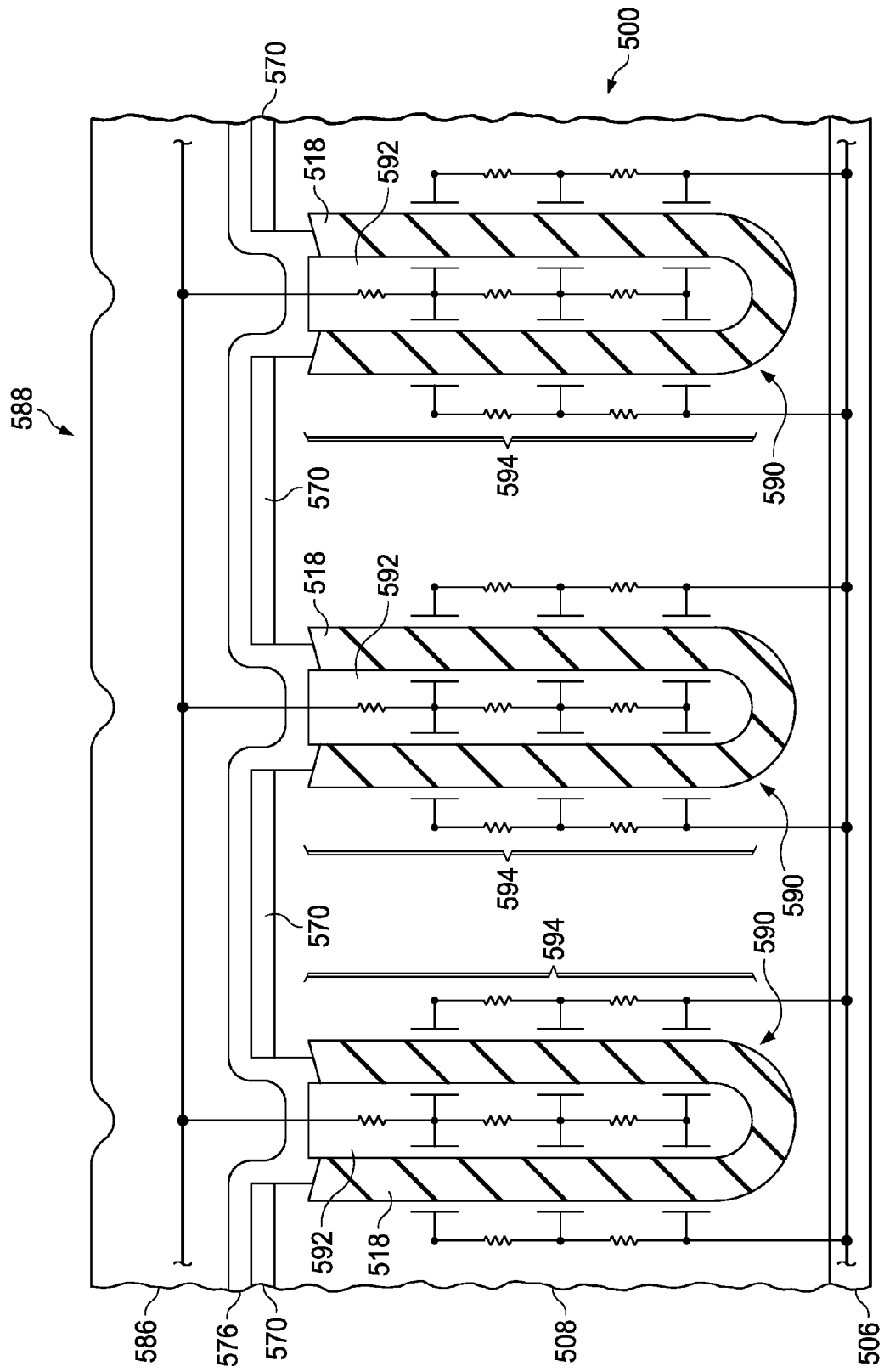
FIG. 5B is a cross section of the semiconductor device through the integrated snubber.

FIG. 5B is a cross section of the semiconductor device 500 through the integrated snubber 588. The snubber trenches 590 are disposed in the drain drift region 508 over the drain contact region 506. The snubber capacitor plates 592 are connected to a contact metal stack 576, for example as described in reference to FIG. 1P. A source metal layer 586 is formed over and in electrical connection with the contact metal stack 576. The contact metal stack 576 is isolated from the drain drift region 508 by a PMD layer 570, formed, for example, as described in reference to FIG. 1N.

The snubber capacitor plates 592, the trench liner 518 in the snubber trenches 590 and the drain drift region 508 combine to provide a snubber filter 594, depicted schematically in FIG. 5B, between the drain contact region 506 and the source metal layer 586. The snubber capacitor plates 592 and the drain drift region 508 provide distributed resistors of the snubber filter 594. The snubber capacitor plates 592, the trench liner 518 in the snubber trenches 590 and the drain drift region 508 provide a first capacitor plate, a capacitor insulator and a second capacitor plate, respectively, of the snubber filter 594. Forming the snubber filter 594 concurrently with elements of the medium voltage MOSFET 504 attached to the integrated snubber 588 may advantageously reduce a cost and fabrication complexity of the semiconductor device 500. An average doping density in the snubber capacitor plates 592 may be lower than an average doping density in the RESURF field plates 520, to provide a desired time constant of the snubber filter 594. For example, the average doping density in the snubber capacitor plates 592 may be 25 percent to 50 percent of the RESURF field plates 520. Alternatively, the average doping density in the snubber capacitor plates 592 and the average doping density in the transistor RESURF trenches 514 and the perimeter RESURF trench 516 may be substantially equal, in order to simplify the fabrication cost and complexity of the semiconductor device 500.

Figure 5C:
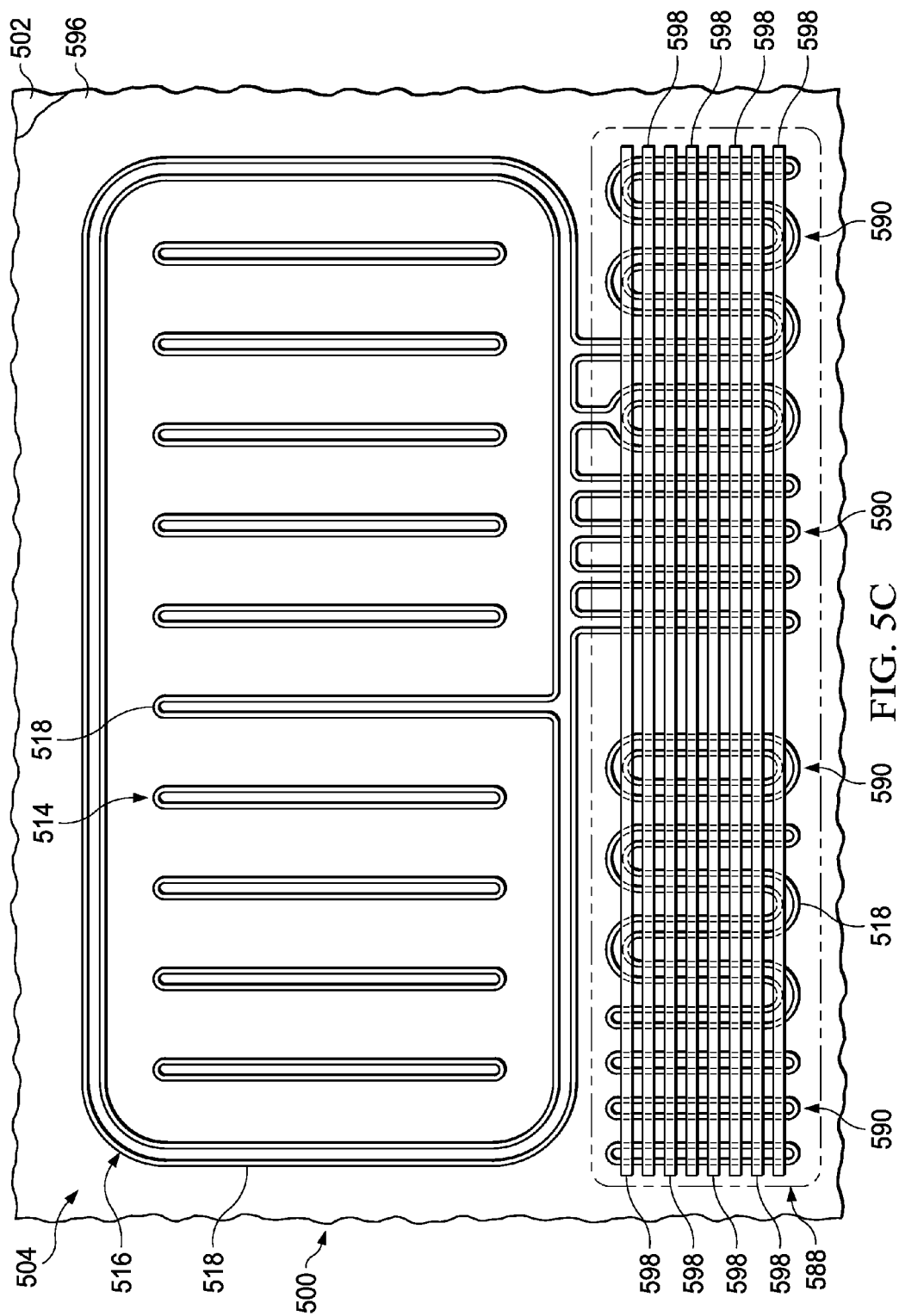
FIG. 5C and FIG. 5D are top views of the semiconductor device, depicted exemplary methods of providing a lower average doping density in the snubber capacitor plates.
Figure 5D:
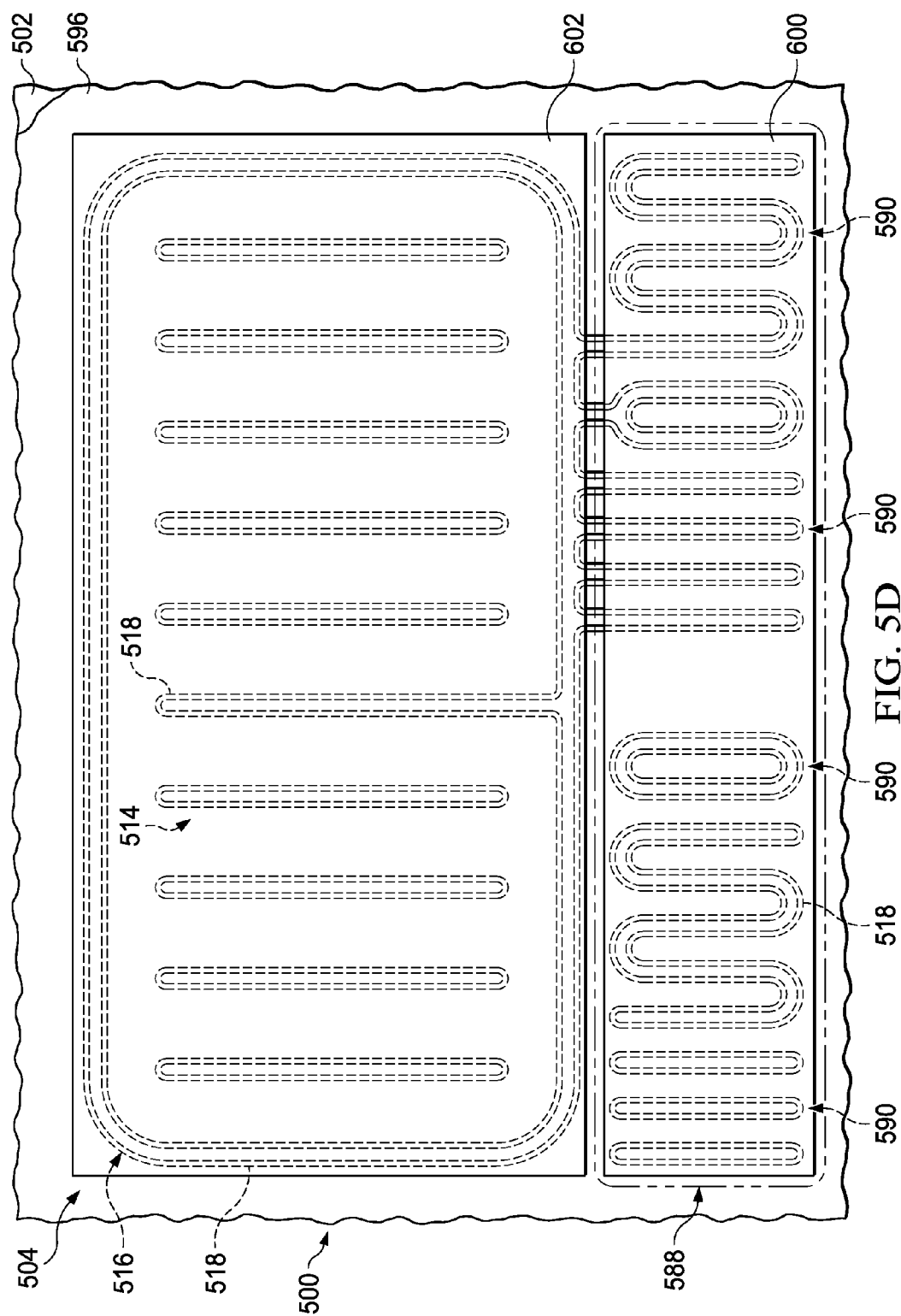

FIG. 5C and FIG. 5D are top views of the semiconductor device 500, depicted exemplary methods of providing a lower average doping density in the snubber capacitor plates 592. Referring to FIG. 5C, a layer of polysilicon 596 is formed on the trench liner 518 in the transistor RESURF trenches 514, the perimeter RESURF trench 516 and the snubber trenches 590 and over a top surface of the substrate 502, as described in reference to FIG. 1C. A snubber implant mask 598 is formed over the snubber trenches 590 which partially exposes the layer of polysilicon 596, for example using an alternating line-space pattern as depicted in FIG. 5C. The snubber implant mask 598 is depicted in FIG. 5C with a stipple pattern. N-type dopants are implanted into the layer of polysilicon 596 for example as described in reference to FIG. 1C, so that the layer of polysilicon 596 over the snubber trenches 590 receives a fraction of a dose received by the layer of polysilicon 596 over the transistor RESURF trenches 514 and the perimeter RESURF trench 516. The snubber implant mask 598 is subsequently removed and a thermal drive operation as described in reference to FIG. 1C diffuses the n-type dopants into the polysilicon in the transistor RESURF trenches 514, the perimeter RESURF trench 516 and the snubber trenches 590, so that an average doping density of the polysilicon in the snubber trenches 590 is a desired fraction of an average doping density of the polysilicon in the transistor RESURF trenches 514 and the perimeter RESURF trench 516. The polysilicon layer 596 is removed from over the top surface of the substrate 502, leaving the snubber capacitor plates 592 with a desired resistivity.

Referring to FIG. 5D, a layer of polysilicon 596 is formed on the trench liner 518 in the transistor RESURF trenches 514, the perimeter RESURF trench 516 and the snubber trenches 590 and over a top surface of the substrate 502. A RESURF trench implant mask 600 is formed over the snubber trenches 590 which exposes the transistor RESURF trenches 514 and the perimeter RESURF trench 516; the RESURF trench implant mask 600 is depicted in FIG. 5D with a stipple pattern. A first set of n-type dopants is implanted into the layer of polysilicon 596 over the transistor RESURF trenches 514 and the perimeter RESURF trench 516; the RESURF trench implant mask 600 blocks at least a portion of the first set of n-type dopants from the layer of polysilicon 596 over the snubber trenches 590. The RESURF trench implant mask 600 is removed after the first set of n-type dopants is implanted. An optional snubber implant mask 598 may be formed over the transistor RESURF trenches 514 and the perimeter RESURF trench 516 which exposes the snubber trenches 590; the snubber implant mask 598 is depicted in FIG. 5D with a light stipple pattern. A second set of n-type dopants, for example arsenic or a combination of arsenic and phosphorus, at a total dose of $5 \times 10^{14}$ cm$^{-2}$ to $1 \times 10^{15}$ cm$^{-2}$, is implanted into the layer of polysilicon 596 over the snubber trenches 590. The snubber implant mask 598, if present, blocks at least a portion of the second set of n-type dopants from the layer of polysilicon 596 over the transistor RESURF trenches 514 and the perimeter RESURF trench 516. The snubber implant mask 598 is removed after the second set of n-type dopants is implanted. A thermal drive operation as described in reference to FIG. 1C diffuses the first set of n-type dopants into the polysilicon in the transistor RESURF trenches 514 and the perimeter RESURF trench 516, and diffuses the second set of n-type dopants into the snubber trenches 590. The polysilicon layer 596 is removed from over the top surface of the substrate 502, leaving the snubber capacitor plates 592 with a desired resistivity.

Figure 5E:
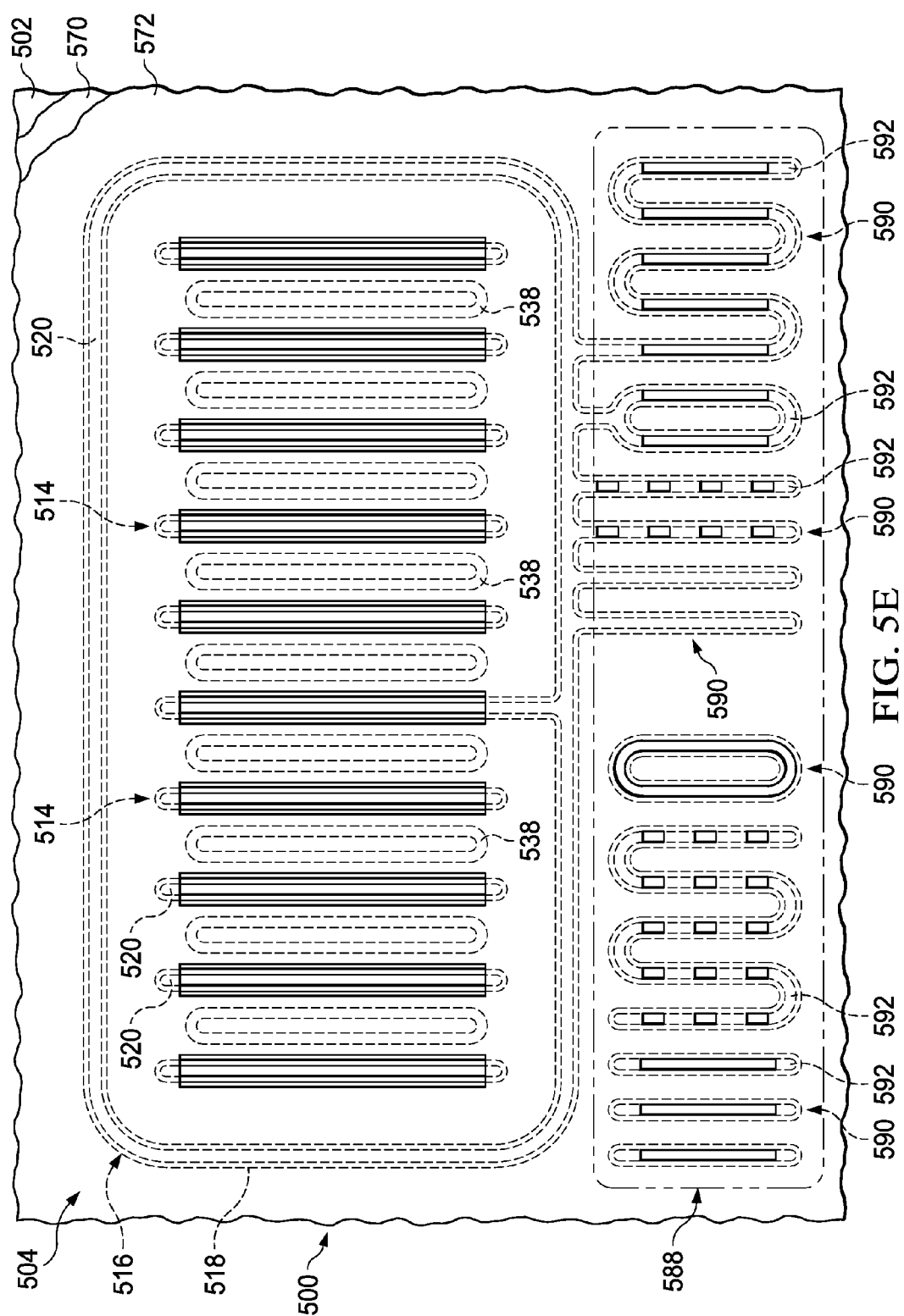
FIG. 5E is a top view of the semiconductor device, depicted exemplary configurations of forming electrical contacts to the snubber capacitor plates.

FIG. 5E is a top view of the semiconductor device 500, depicted exemplary configurations of forming electrical contacts to the snubber capacitor plates 592. A source-contact etch mask 572 is formed over a PMD layer 570; the source-contact etch mask 572 is depicted in FIG. 5D with a stipple pattern. The source-contact etch mask 572 exposes the PMD layer 570 in regions along the transistor RESURF trenches 514 and over portions of the substrate 502 immediately abutting the transistor RESURF trenches 514, not extending to the split gate 538, as described in reference to FIG. 1O. In one version of the instant example, the source-contact etch mask 572 further exposes the PMD layer 570 over the snubber capacitor plates 592, not extending to the substrate 502 abutting the snubber trenches 590. The source-contact etch mask 572 may expose the PMD layer 570 over intermittent portions of the snubber capacitor plates 592, most of the snubber capacitor plates 592, or substantially all of the snubber capacitor plates 592, as depicted in various instances of the snubber trenches 590 in FIG. 5E. In another version of the instant example, instances of the snubber trenches 590 which connect to the perimeter RESURF trench 516 of the transistor RESURF trenches 514 may be free of exposed regions of the source-contact etch mask 572; the snubber capacitor plates 592 are directly electrically coupled to the RESURF field plates 520.

A source contact etch as described in reference to FIG. 1O forms source-contact trenches which expose the snubber capacitor plates 592 concurrently with the RESURF field plates 520 in the transistor RESURF trenches 514. A contact layer stack and source contact metal are subsequently formed over an existing top surface of the semiconductor device 500 as described in reference to FIG. 1P to make electrical connections to the snubber capacitor plates 592 concurrently with the RESURF field plates 520. Forming intermittent contacts to the snubber capacitor plates 592 may provide a desired resistance to the snubber capacitor plates 592 and hence a desired time constant for the integrated snubber 588, enabling the snubber capacitor plates 592 and the RESURF field plates 520 to have substantially the same average doping densities, and so advantageously eliminating the implant masks described in reference to FIG. 5C and FIG. 5D.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A semiconductor device, comprising:
a substrate;
a drain drift region of a first conductivity type disposed in said substrate;
transistor RESURF trenches defined in said drain drift region, said transistor RESURF trenches each having a trench liner of dielectric material and a RESURF field plate disposed on said trench liner;
a split gate disposed over said drain drift region between said transistor RESURF trenches, said split gate having a central opening;
a body region of a second conductivity type, opposite from said first conductivity type, disposed in said substrate abutting said transistor RESURF trenches;
a source region formed in said body region;
a two-level lightly doped drain (LDD) region of said first conductivity type disposed in said substrate under said central openings in said split gate;
source-contact trenches defined into said transistor RESURF trenches from a top surface of said substrate, said source-contact trenches exposing said source region; and
a contact metal stack disposed in said source-contact trenches, said contact metal stack making contact with said source region and said RESURF field plate in each of said transistor RESURF trenches.

2. The semiconductor device of claim 1, further comprising a perimeter RESURF trench surrounding said transistor RESURF trenches, in which said perimeter RESURF trench is connected to at least one instance of said transistor RESURF trenches so that said RESURF field plate in said perimeter RESURF trench is electrically connected to said RESURF field plate in said at least one instance of said transistor RESURF trenches.

3. The semiconductor device of claim 1, further comprising a perimeter RESURF trench surrounding said transistor RESURF trenches, in which said perimeter RESURF trench is free of connections to said transistor RESURF trenches and said RESURF field plate in said perimeter RESURF trench is electrically connected to said contact metal stack.

4. The semiconductor device of claim 1, further comprising a perimeter RESURF trench surrounding said transistor RESURF trenches, in which said RESURF field plate in said perimeter RESURF trench and said RESURF field plate in said transistor RESURF trenches comprise silicon.

5. The semiconductor device of claim 1, in which said contact metal stack includes a layer of titanium disposed on lateral sides and bottoms of said source-contact trenches, and a plurality of layers of titanium nitride disposed on said layer of titanium.

6. The semiconductor device of claim 1, in which said contact metal stack overlaps said split gate.

7. The semiconductor device of claim 1, in which said two-level LDD includes a channel control region and a punch-through region disposed below said channel control region, said punch-through region having a higher average doping density than said channel control region.

8. The semiconductor device of claim 1, further including a pre-metal dielectric (PMD) layer over said substrate adjacent to said split gate, said PMD layer having a stress less than 100 megapascals.

9. The semiconductor device of claim 1, further comprising a perimeter RESURF trench surrounding said transistor RESURF trenches, in which an edge of a drain dielectric layer proximate to said perimeter RESURF trench has a sloped profile of 30 degrees to 60 degrees from a horizontal plane, and said split gate includes link portions which traverse said sloped profile.

10. The semiconductor device of claim 1, further comprising a perimeter RESURF trench surrounding said transistor RESURF trenches, in which said split gate, said body region, said two-level LDD and said source regions are disposed between said transistor RESURF trenches and said perimeter RESURF trench.

\* \* \* \* \*